(12) United States Patent
Kamo et al.

(10) Patent No.: US 12,365,759 B2
(45) Date of Patent: Jul. 22, 2025

(54) ORGANIC ELECTRONIC MATERIAL AND ORGANIC ELECTRONIC ELEMENT

(71) Applicant: Showa Denko Materials Co., Ltd., Tokyo (JP)

(72) Inventors: Kazuyuki Kamo, Tokyo (JP); Iori Fukushima, Tokyo (JP); Tomotsugu Sugioka, Tokyo (JP); Kenichi Ishitsuka, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 989 days.

(21) Appl. No.: 17/279,596

(22) PCT Filed: Sep. 28, 2018

(86) PCT No.: PCT/JP2018/036266
§ 371 (c)(1),
(2) Date: Mar. 25, 2021

(87) PCT Pub. No.: WO2020/065920
PCT Pub. Date: Apr. 2, 2020

(65) Prior Publication Data
US 2021/0340441 A1    Nov. 4, 2021

(51) Int. Cl.
| | | |
|---|---|---|
| C08G 61/12 | (2006.01) |
| C09K 11/06 | (2006.01) |
| H05B 33/14 | (2006.01) |
| H10K 50/11 | (2023.01) |
| H10K 50/15 | (2023.01) |
| H10K 50/16 | (2023.01) |
| H10K 50/17 | (2023.01) |
| H10K 71/12 | (2023.01) |
| H10K 85/10 | (2023.01) |
| H10K 101/10 | (2023.01) |

(52) U.S. Cl.
CPC .............. *C08G 61/12* (2013.01); *C09K 11/06* (2013.01); *H05B 33/14* (2013.01); *H10K 71/12* (2023.02); *H10K 85/111* (2023.02); *C09K 2211/1433* (2013.01); *H10K 50/11* (2023.02); *H10K 50/15* (2023.02); *H10K 50/16* (2023.02); *H10K 50/17* (2023.02); *H10K 2101/10* (2023.02)

(58) Field of Classification Search
None
See application file for complete search history.

(56) References Cited

U.S. PATENT DOCUMENTS

2007/0232782 A1    10/2007   Radu et al.
2019/0252625 A1*   8/2019    Adachi ............... H10K 50/00

FOREIGN PATENT DOCUMENTS

| JP | 2006279007 | 10/2006 | |
| JP | 2012131993 | 7/2012 | |
| JP | 2012131993 A * | 7/2012 | ........... C07D 251/24 |

(Continued)

OTHER PUBLICATIONS

"International Search Report (Form PCT/ISA/210) of PCT/JP2018/036266," mailed on Dec. 25, 2018, with English translation thereof, pp. 1-4.

*Primary Examiner* — Jeffrey D Washville
(74) *Attorney, Agent, or Firm* — JCIPRNET

(57) ABSTRACT

An organic electronic material that includes a charge transporting polymer which has a branched structure and has a structural unit having a structure represented by Formula (1).

18 Claims, 2 Drawing Sheets

(56) References Cited

FOREIGN PATENT DOCUMENTS

| | | |
|---|---|---|
| JP | 2013519740 | 5/2013 |
| JP | 2017059724 | 3/2017 |
| JP | 2017069324 | 4/2017 |
| JP | 2017183409 | 10/2017 |
| JP | WO2018139487 | 12/2019 |
| KR | 20030038453 | 5/2003 |
| WO | 2010140553 | 12/2010 |
| WO | 2018021133 | 2/2018 |

* cited by examiner

ORGANIC ELECTRONIC MATERIAL AND ORGANIC ELECTRONIC ELEMENT

CROSS-REFERENCE TO RELATED APPLICATION

This application is a 371 application of the international PCT application serial no. PCT/JP2018/036266, filed on Sep. 28, 2018. The entirety of the above-mentioned patent application is hereby incorporated by reference herein and made a part of this specification.

TECHNICAL FIELD

Embodiments of the present invention relate to an organic electronic material, a liquid composition, an organic layer, an organic electronic element, an organic electroluminescent element, a display element, a lighting device, a display device, and a method for manufacturing an organic electronic element.

BACKGROUND ART

Organic electronic elements are elements that perform electrical operations using organic substances. Organic electronic elements are expected to exhibit features such as energy saving, low cost, and flexibility, and therefore they are attracting attention in techniques for enabling replacement of conventional inorganic semiconductors mainly composed of silicon. Examples of organic electronic elements include organic electroluminescent elements (organic EL elements), organic photoelectric conversion elements, organic transistors, and the like.

Organic EL elements are attracting attention for use in large-area solid-state light source applications in place of, for example, incandescent lamps or gas-filled lamps. They are also attracting attention as the most promising self-luminous displays in place of liquid crystal displays (LCDs) in the field of flat panel displays (FPDs), and therefore commercialization of organic EL elements is progressing.

According to organic materials that are used, organic EL elements are roughly classified into two types: low-molecular-weight organic EL elements and high-molecular-weight organic EL elements. As organic materials, high-molecular-weight compounds are used for the high-molecular-weight organic EL elements, and low-molecular-weight compounds are used for the low-molecular-weight organic EL elements. Meanwhile, methods for manufacturing an organic EL element are roughly classified into two categories: a dry-type process in which film formation is performed mainly in a vacuum system, and a wet-type process in which film formation is performed by plate printing such as relief printing and intaglio printing, plateless printing such as inkjet printing, and the like. The wet-type process is expected as an indispensable method for future large-screen organic EL displays, because it enables simple film formation.

Accordingly, materials suitable for the wet-type process are being developed, and for example, studies are being conducted to form a multilayer structure using a charge transporting compound having a polymerizable functional group (refer to Patent Literature 1).

CITATION LIST

Patent Literature

Patent Literature 1

Japanese Patent Laid-Open No. 2006-279007

SUMMARY OF INVENTION

Technical Problem

An organic EL element manufactured by the wet-type process has features of easy realization of lower cost and larger area. However, there is room for improvement in terms of making the wet-type process more efficient and improving element characteristics.

Accordingly, the present invention provides an organic electronic material that has high solubility and enables formation of an organic layer having high charge transportability. The present invention further provides a liquid composition that can be easily prepared and enables formation of an organic layer having high charge transportability. The present invention still further provides an organic layer that can be efficiently formed by a wet-type process and has high charge transportability. The present invention still further provides an organic electronic element, an organic EL element, a display element, a lighting device, and a display device, all of which have excellent lifespan characteristics.

Solution to Problem

Solution to Problem

The present invention includes various embodiments. Examples of the embodiments are shown below. The present invention is not limited to the following embodiments.

One embodiment relates to an organic electronic material including a charge transporting polymer which has a branched structure and has a structural unit having a structure represented by Formula (1).

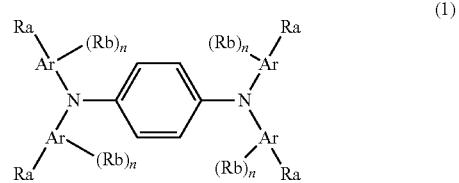

(In the formula, Ar's each independently represent an aromatic ring group, Ra's each independently represent a hydrogen atom, a substituent, or a binding site with another structure, Rb's each independently represent a substituent, and n's each independently represent an integer of 0 or more, where at least one of Ra's is a binding site with another structure).

Another embodiment relates to a liquid composition including the above-described organic electronic material and a solvent.

Still another embodiment relates to an organic layer which is formed using the above-described organic electronic material or the above-described liquid composition.

Still another embodiment relates to an organic electronic element including the above-described organic layer.

Still another embodiment relates to an organic electroluminescent element including the above-described organic layer.

Still another embodiment relates to a display element including the above-described organic electroluminescent element; a lighting device including the above-described organic electroluminescent element; or a display device including the above-described lighting device, and a liquid crystal element as a display means.

Still another embodiment relates to a method for manufacturing an organic electronic element, the method including forming an organic layer using the above-described organic electronic material or the above-described liquid composition.

Advantageous Effects of Invention

According to an embodiment of the present invention, it is possible to provide an organic electronic material that has high solubility and enables formation of an organic layer having high charge transportability. According to another embodiment of the present invention, it is possible to provide a liquid composition that can be easily prepared and enables formation of an organic layer having high charge transportability. According to still another embodiment of the present invention, it is possible to provide an organic layer that can be efficiently formed by a wet-type process and has high charge transportability. According to still another embodiment of the present invention, it is possible to provide an organic electronic element, an organic EL element, a display element, a lighting device, and a display device, all of which have excellent lifespan characteristics.

DESCRIPTION OF EMBODIMENTS

Figure 1:
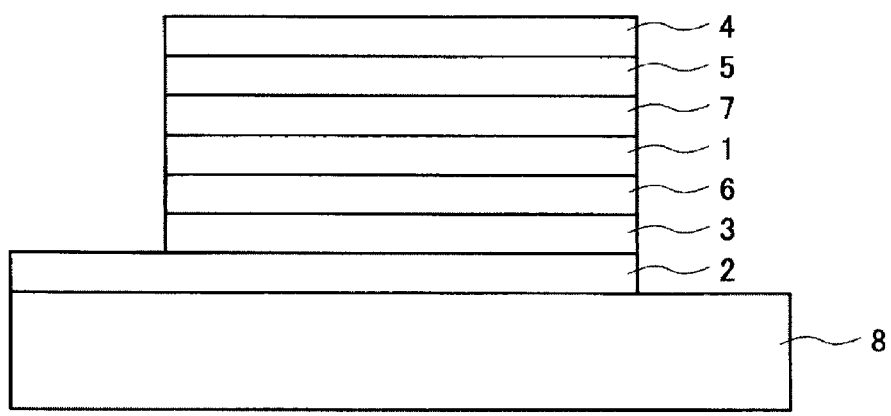
FIG. 1 is a schematic cross-sectional view showing an example of an organic EL element according to an embodiment of the present invention.

Embodiments of the present invention will be described. The present invention is not limited to the following embodiments.

<Organic Electronic Material>

An organic electronic material according to the embodiment of the present invention contains a charge transporting polymer which has a branched structure and has a structural unit having a structure represented by Formula (1). The organic electronic material may contain only one kind of charge transporting polymer or may contain two or more kinds thereof. Comparing to a low-molecular-weight compound, the charge transporting polymer is preferable from the viewpoint of its excellent film forming properties in a wet-type process.

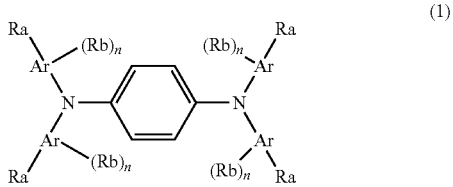

(1)

In the formula, Ar's each independently represent an aromatic ring group, Ra's each independently represent a hydrogen atom, a substituent, or a binding site with another structure, Rb's each independently represent a substituent, and n's each independently represent an integer of 0 or more. At least one of Ra's is a binding site with another structure.

[Charge Transporting Polymer]

The charge transporting polymer is a polymer having an ability to transport charges, and is preferably a hole transporting polymer having an ability to transport holes. The charge transporting polymer has a branched structure branched in three or more directions and has the structure represented by Formula (1).

It is thought that charge transportability is improved because the charge transporting polymer has the structure represented by Formula (1). In particular, the charge transporting polymer exhibits a high hole transporting ability in a case where it has the structural unit having the structure represented by Formula (1) and a structural unit having hole transportability. The "structural unit having hole transportability" is a structural unit different from the "structural unit having the structure represented by Formula (1)." Furthermore, although the reason is unclear, when the charge transporting polymer has the structure represented by Formula (1), solubility thereof in a solvent is improved.

(Structural Unit Having Structure Represented by Formula (1))

The charge transporting polymer has the structural unit having the structure represented by Formula (1). In the following description, the "structure represented by Formula (1)" may be referred to as a "structure (1)," and the "structural unit having the structure represented by Formula (1)" may be referred to as a "structural unit (1)." The charge transporting polymer may contain only one kind of structural unit (1) or two or more kinds thereof.

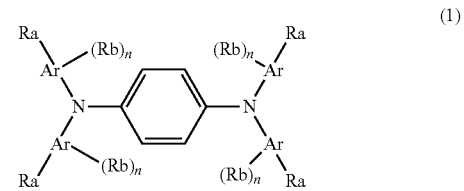

(1)

In the formula, Ar's each independently represent an aromatic ring group, Ra's each independently represent a hydrogen atom, a substituent, or a binding site with another structure, Rb's each independently represent a substituent, and n's each independently represent an integer of 0 or more. At least one of Ra's is a binding site with another structure.

An aromatic ring group is an atomic group obtained by removing one or more hydrogen atoms from an aromatic ring. The aromatic ring is preferably an aromatic ring having 2 to 30 carbon atoms. Examples of aromatic rings include aromatic hydrocarbon rings and aromatic heterocyclic rings. In addition, examples of aromatic rings include monocyclic rings and fused rings. Examples of aromatic hydrocarbon rings include benzene, naphthalene, anthracene, tetracene, fluorene, phenanthrene, 9,10-dihydrophenanthrene, triphenylene, pyrene, chrysene, perylene, pentacene, benzopyrene, and the like. Examples of aromatic heterocyclic rings include pyridine, pyrazine, quinoline, isoquinoline, acridine, phenanthroline, carbazole, furan, benzofuran, dibenzofuran, pyrrole, thiophene, benzothiophene, dibenzothiophene, oxazole, oxadiazole, thiadiazole, triazole, benzoxazole, benzoxadiazole, benzothiadiazole, benzotriazole, benzothiophene, and the like.

From the viewpoint of improving solubility and charge transportability, the aromatic ring is preferably an aromatic hydrocarbon ring, is more preferably an aromatic hydrocarbon ring having 6 to 30 carbon atoms, and is even more preferably benzene.

In a case where Ra is a substituent, examples of substituents include a substituent (hereinafter, may be referred to as a "substituent X") selected from the group consisting of $-R^1$, $-OR^2$, $-SR^3$, $-OCOR^4$, $-COOR^5$, $-SiR^6R^7R^8$, halogen atom, and groups having polymerizable functional groups to be described later.

$R^1$ is selected from the group consisting of an alkyl group, an aryl group, and a heteroaryl group. $R^2$ to $R^{10}$ are each independently selected from the group consisting of a hydrogen atom, an alkyl group, an aryl group, and a heteroaryl group.

An alkyl group may be linear, branched, or cyclic. The number of carbon atoms of an alkyl group is preferably 1 to 22. The number of carbon atoms of an aryl group is preferably 6 to 30. The number of carbon atoms of a heteroaryl group is preferably 2 to 30. An alkyl group, an aryl group, and a heteroaryl group may be substituted or unsubstituted.

Examples of substituents in a case where an alkyl group, an aryl group, and a heteroaryl group further have a substituent include the above-mentioned substituent X, and the substituent is preferably $-R^1$.

Examples of alkyl groups include a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an isopropyl group, an isobutyl group, a sec-butyl group, a tert-butyl group, a 2-ethylhexyl group, a 3,7-dimethyloctyl group, a cyclohexyl group, a cycloheptyl group, a cyclooctyl group, and the like.

In the present specification, an aryl group is an atomic group obtained by removing one hydrogen atom from an aromatic hydrocarbon. A heteroaryl group is an atomic group obtained by removing one hydrogen atom from an aromatic heterocyclic compound.

Examples of aromatic hydrocarbons include a monocyclic ring, a fused ring, or a polycyclic ring in which two or more selected from monocyclic rings and fused rings are bonded via a direct bond. Examples of aromatic heterocyclic compounds include a monocyclic ring, a fused ring, or a polycyclic ring in which two or more selected from monocyclic rings and fused rings are bonded via a direct bond.

Examples of aromatic hydrocarbons include benzene, naphthalene, anthracene, tetracene, fluorene, phenanthrene, 9,10-dihydrophenanthrene, triphenylene, pyrene, chrysene, perylene, pentacene, benzopyrene, biphenyl, terphenyl, triphenylbenzene, and the like. Examples of aromatic heterocyclic compounds include pyridine, pyrazine, quinoline, isoquinoline, acridine, phenanthroline, carbazole, furan, benzofuran, dibenzofuran, pyrrole, thiophene, benzothiophene, dibenzothiophene, oxazole, oxadiazole, thiadiazole, triazole, benzoxazole, benzoxadiazole, benzothiadiazole, benzotriazole, benzothiophene, bithiophene, and the like.

Examples of halogen atoms include a fluorine atom, a chlorine atom, a bromine atom, an iodine atom, and the like. The halogen atom is preferably a fluorine atom.

In a case where Ra has a substituent, the number of substituents is 1 to 3, and is preferably 1 or 2. In a case where a plurality of Ra's is substituents, the plurality of substituents may be the same as or different from each other.

At least one of Ra's is a binding site with another structure. The "other structure" is a structure other than a hydrogen atom and the above-mentioned substituents. In a case where four Ra's are binding sites, the structure (1) is a tetravalent structure, in a case where three Ra's are binding sites, the structure (1) is a trivalent structure, in a case where two Ra's are binding sites, the structure (1) is a divalent structure, and in a case where one Ra is a binding site, the structure (1) is a monovalent structure. The number of binding sites is preferably 2 or 4, because then it is possible to obtain effects in which solubility and charge transportability are further improved. That is, the structure (1) is preferably divalent or tetravalent.

Ra, which is not a substituent and a binding site, is a hydrogen atom. The number of hydrogen atoms is 0 to 3. All Ra's other than a binding site may be hydrogen atoms.

Rb represents a substituent. Examples of substituents include the above-mentioned substituent X. In a case where the structure (1) has a plurality of Rb's, the plurality of Rb's may be the same as or different from each other. In a case where the structure (1) has Rb, and Ra as a substituent, Rb and Ra may be the same as or different from each other.

n represents the number of Rb's. n is an integer of 0 or more, and an upper limit of n is determined according to the type of Ar. In a case where Ar is a benzene ring group, an upper limit of n is 4, and in a case where Ar is a naphthalene ring group, an upper limit of n is 6. n may be 0 in consideration of the influence of substituents.

Examples of the structure (1) are shown below. The structure (1) is not limited to structures represented by the following formulas. In the present specification, "*" represents a binding site with another structure.

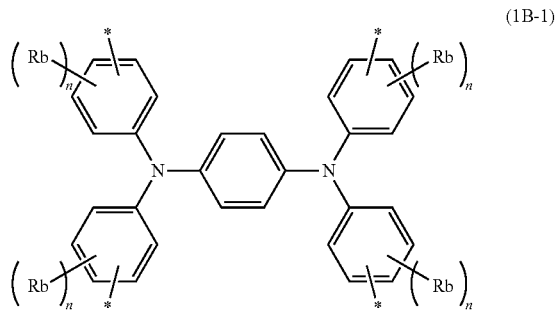

(1B-1)

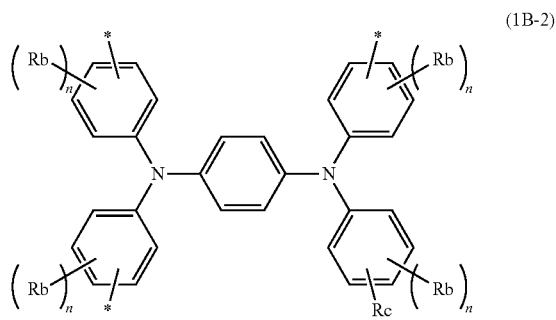

(1B-2)

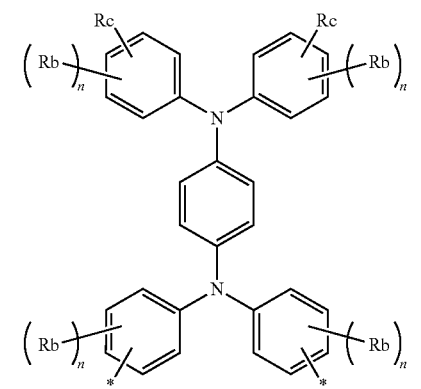

(1L-1)

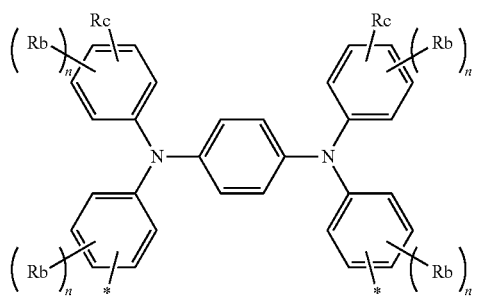

(1L-2)

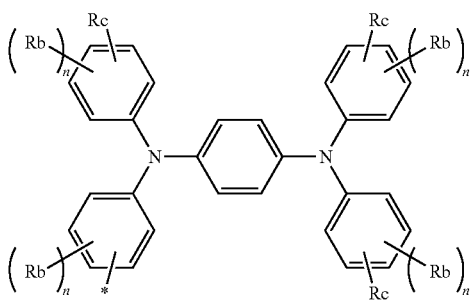

(1T)

In the formulas, Re's each independently represent a hydrogen atom or a substituent, Rb's each independently represent a substituent, and n's each independently represent an integer of 0 to 4.

In a case where Rc is a substituent, examples of substituents include the above-mentioned substituent X. In each of the structures, in a case where Rc has a substituent, the number of substituents is 1 to 3, and is preferably 1 or 2. In a case where a plurality of Rc's is a substituent, the plurality of substituents may be the same as or different from each other. In each of the structures, Re which is not a substituent is a hydrogen atom. The number of hydrogen atoms is 0 to 3. All Re's may be hydrogen atoms.

Rb is a substituent, and examples of substituents include the above-mentioned substituent X. In each of the structures, in a case where a plurality of Rb's is present, the plurality of Rb's may be the same as or different from each other. In each of the structures, in a case where Rb, and Rc as a substituent are present, Rb and Rc may be the same as or different from each other.

n represents the number of Rb's. n's are each independently an integer of 0 to 4, and may be 0 in consideration of the influence of substituents.

According to a preferred embodiment, the structure (1) preferably includes the structure represented by Formula (1B-1). In Formula (1B-1), it is preferable that n's be each independently 0 or 1, and it is more preferable that all n's be 0.

According to a preferred embodiment, the structure (1) preferably includes at least one selected from the group consisting of the structure represented by Formula (1L-1) and the structure represented by Formula (1L-2), and more preferably includes the structure represented by Formula (1L-1). In each of Formulas (1L-1) and (1L-2), it is preferable that n's be each independently 0 or 1, and it is more preferable that all n's be 0. It is preferable that Re's each independently represent a substituent. According to a preferred embodiment, in each of Formulas (1L-1) and (1L-2), both Re's are preferably a halogen atom or a halogen-substituted alkyl group, are more preferably a halogen atom, and are even more preferably a fluorine atom. According to another preferred embodiment, in each of Formulas (1L-1) and (1L-2), one of Re's is preferably a halogen atom or a halogen-substituted alkyl group, is more preferably a halogen atom, and is even more preferably a fluorine atom. The other Re is preferably an alkyl group, is more preferably a linear alkyl group, is even more preferably a linear alkyl group having 3 to 12 carbon atoms, and is particularly preferably a linear alkyl group having 6 to 12 carbon atoms.

Preferred specific examples of the structure (1) are shown below. The structure (1) is not limited to structures represented by the following formulas.

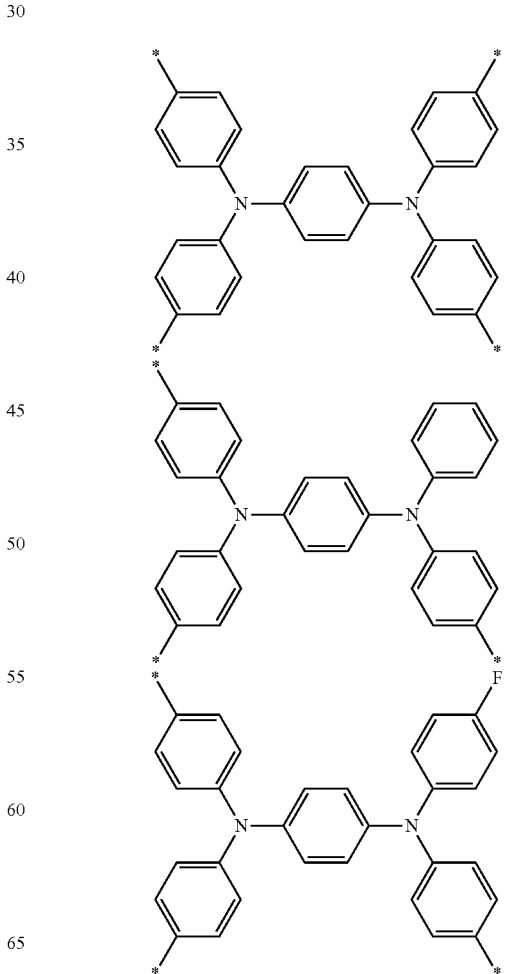

-continued

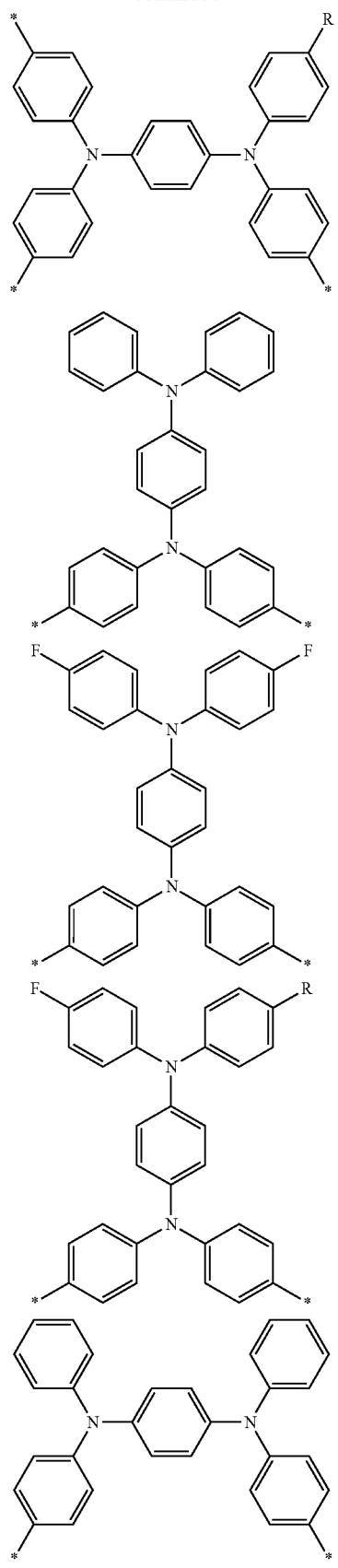

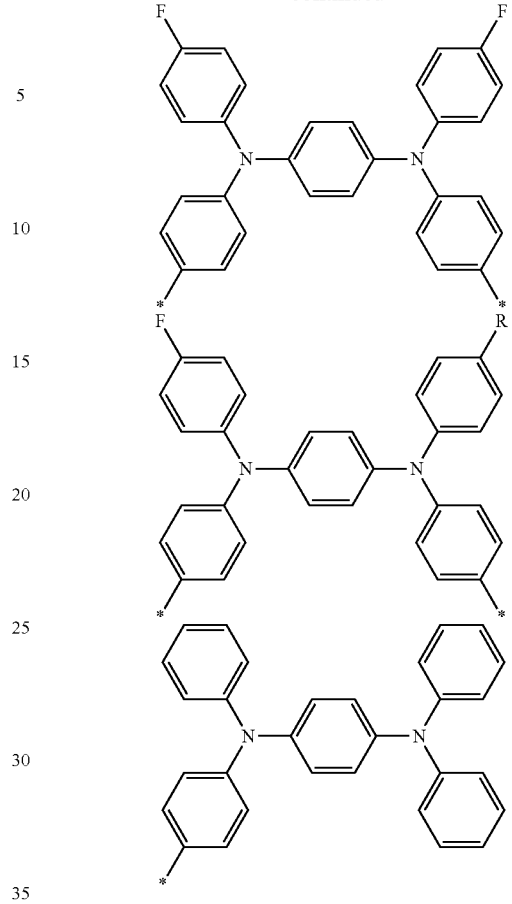

In the above formulas, R represents an alkyl group. An alkyl group is preferably a linear alkyl group, is more preferably a linear alkyl group having 3 to 12 carbon atoms, and is even more preferably a linear alkyl group having 6 to 12 carbon atoms.

The structural unit (1) is a structural unit having at least one structure (1). The structural unit (1) is preferably monovalent, divalent, trivalent, or tetravalent, and is more preferably divalent or tetravalent, because it is possible to obtain an effect in which charge transportability is further improved.

Examples of the structural unit (1) are shown below. The structural unit (1) is not limited to structural units represented by the following formulas.

 (B1-1)

 (B1-2)

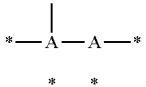 (B1-3)

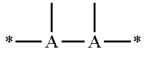 (B1-4)

-continued

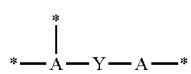 (B1-5)

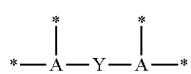 (B1-6)

 (B1-7)

 (B1-8)

 (B1-9)

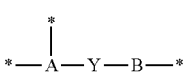 (B1-10)

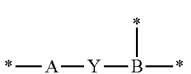 (B1-11)

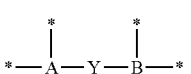 (B1-12)

*—A—* (L1-1)

*—A—A—* (L1-2)

*—A—Y—A—* (L1-3)

*—A—B—* (L1-4)

*—A—Y—B—* (L1-5)

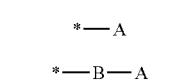 (L1-6)

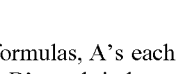 (L1-7)

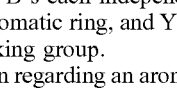 (L1-8)

*—A (T1-1)

*—B—A (T1-2)

In the above formulas, A's each independently represent the structure (1), B's each independently represent a structure having an aromatic ring, and Y represents a direct bond or a divalent linking group.

The description regarding an aromatic ring in Formula (1) can be applied to an aromatic ring included in B. A divalent linking group is, for example, a divalent group obtained by further removing one hydrogen atom from a group having one or more hydrogen atoms among the substituents X (where a group having a polymerizable functional group is excluded).

In a case where the structure (1) is included in the charge transporting polymer as a structural unit forming a skeletal structure of a molecular chain, it is likely to obtain an effect in which charge transportability is further improved. From this viewpoint, the structural unit (1) is preferably a structural unit represented by any of Formulas (B1-1) to (B1-12), Formulas (L1-1) to (L1-5), and Formulas (T1-1) and (T1-2).

Since it is possible to obtain an effect in which charge transportability is further improved, the structural unit (1) is more preferably a structural unit represented by any of Formula (B1-1), Formula (B1-2), Formula (L1-1), and Formula (T1-1); the structural unit (1) is more preferably a structural unit represented by any of Formula (B1-1), Formula (L1-1), and Formula (T1-1); and the structural unit (1) is even more preferably a structural unit represented by any of Formula (B1-1) and Formula (L1-1). These units are preferable units also from the viewpoint that they are likely to easily synthesize a desired charge transporting polymer.

The structure (1) may be included in the charge transporting polymer as a substituent on a skeletal structure of a molecular chain. In a case where it is included as a substituent on the skeletal structure of the molecular chain, the structural unit (1) is a structural unit represented by, for example, any of Formulas (L1-6) to (L1-8). Specific examples thereof include the same structural units as structural units exemplified as specific examples in the description of a structural unit L2 to be described later, except that the structural unit L2 has R' instead of R. R' represents a hydrogen atom or a substituent, and it is preferable that substituents be each independently the substituent X or a group having the structure (1). However, in each of the structural units, at least one of R's is a group having the structure (1).

(Structure of Charge Transporting Polymer)

The charge transporting polymer has the structural unit (1). The charge transporting polymer preferably further has a structural unit having hole transportability. The charge transporting polymer is a branched polymer and has a branched structure in a molecule. A structural unit constituting the charge transporting polymer includes at least a trivalent or higher-valent structural unit B and a monovalent structural unit T. The charge transporting polymer may further have a divalent structural unit. The structural unit B is a structural unit constituting a branch portion. The structural unit T is a structural unit constituting a terminal portion of a molecular chain. A structural unit L is preferably a structural unit having charge transportability.

The charge transporting polymer may have only one kind of each of the structural units, or may contain a plurality of kinds of each of the structural units. In the charge transporting polymer, the structural units are respectively bonded to each other at "one" to "three or more" binding sites.

According to a preferred embodiment, the branched structure has at least one structural unit B and at least three or more structural units L bonded to the one structural unit B. The branched structure preferably has a multi-branched structure having at least the following units: one structural unit B, and three or more structural units L bonded to the one structural unit B; one different structural unit B bonded to each of the three or more structural units L; and two or more different structural units L bonded to the one different structural unit B.

The charge transporting polymer has at least one structural unit (1) as at least one selected from the group consisting of the "structural unit B," the "structural unit L," and the "structural unit T." Preferred examples of charge transporting polymers are described below. Since it is likely to obtain an effect in which charge transportability is further improved, the charge transporting polymer preferably satisfies at least one of (A), (B), and (D), and more preferably satisfies at least one of (B) and (D).

(A) Charge transporting polymer having at least a structural unit B and a structural unit T, in which at least the structural unit B has a structural unit (1)

(B) Charge transporting polymer having a structural unit B, a structural unit L, and a structural unit T, in which at least the structural unit B has a structural unit (1)
(C) Charge transporting polymer having at least a structural unit B and a structural unit T, in which at least the structural unit T has a structural unit (1)
(D) Charge transporting polymer having a structural unit B, a structural unit L, and a structural unit T, in which at least the structural unit L has a structural unit (1)

The charge transporting polymer having the structural unit (1) preferably further has a structural unit having hole transportability. The structural unit having hole transportability is not particularly limited as long as it contains an atomic group having an ability to transport charges. The structural unit having hole transportability may be monovalent, divalent, or trivalent or higher-valent. The structural unit having hole transportability is preferably hexavalent or less, and is more preferably tetravalent or less. For example, the charge transporting polymer has at least one structural unit having hole transportability as at least one selected from the group consisting of the "structural unit B," the "structural unit L," and the "structural unit T."

Preferred examples of charge transporting polymers having a structural unit having hole transportability are described below. The following charge transporting polymers (a) to (d) also have the structural unit (1). Since it is likely to obtain an effect in which charge transportability is further improved, the charge transporting polymer preferably satisfies at least one of (a) to (d).

(a) Charge transporting polymer having at least a structural unit B and a structural unit T, in which at least the structural unit B has a structural unit having hole transportability
(b) Charge transporting polymer having a structural unit B, a structural unit L, and a structural unit T, in which at least the structural unit B has a structural unit having hole transportability
(c) Charge transporting polymer having at least a structural unit B and a structural unit T, in which at least the structural unit T has a structural unit having hole transportability
(d) Charge transporting polymer having a structural unit B, a structural unit L, and a structural unit T, in which at least the structural unit L has a structural unit having hole transportability The charge transporting polymer having the structural unit (1) and the structural unit having hole transportability is preferably a charge transporting polymer satisfying at least any one selected from the group consisting of (A) to (D) and at least any one selected from the group consisting of (a) to (d). Specifically, a charge transporting polymer satisfying (B) and (d) or a charge transporting polymer satisfying (D) and (b) is preferable.

The structural unit having hole transportability preferably includes a structural unit having at least one structure selected from the group consisting of an aromatic amine structure, a carbazole structure, a thiophene structure, a fluorene structure, a benzene structure, a pyrrole structure, an aniline structure, and a phenoxazine structure. These structures may be substituted or unsubstituted. For the reason that high hole injectability, hole transportability, and the like can be obtained, a structural unit having hole transportability more preferably includes a structural unit having at least one structure selected from the group consisting of an aromatic amine structure, a carbazole structure, a thiophene structure, a fluorene structure, a benzene structure, a pyrrole structure (where these structures are substituted or unsubstituted), even more preferably includes a structural unit having at least one structure selected from the group consisting of an aromatic amine structure, a carbazole structure, a thiophene structure, and a pyrrole structure (where these structures are substituted or unsubstituted), and particularly preferably includes a structural unit having at least one structure selected from the group consisting of a substituted or unsubstituted aromatic amine structure, and a substituted or unsubstituted carbazole structure. The aromatic amine structure is preferably a structure selected from the group consisting of a diarylamine structure and a triarylamine structure, is more preferably a triarylamine structure, and is even more preferably a triphenylamine structure.

Examples of structures included in the charge transporting polymer are shown below. In structures, "B" represents a structural unit B, "L" represents a structural unit L, and "T" represents a structural unit T. In the following structures, a plurality of structural units B's may be the same as or different from each other. The same applies to L and T. The charge transporting polymer is not limited to charge transporting polymers having the following structures.

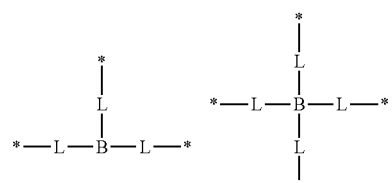

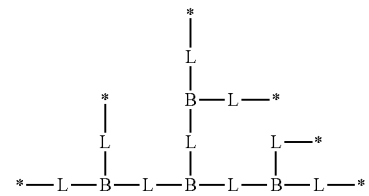

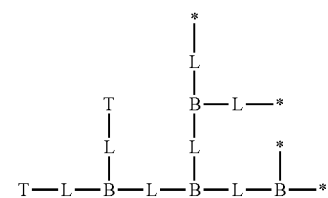

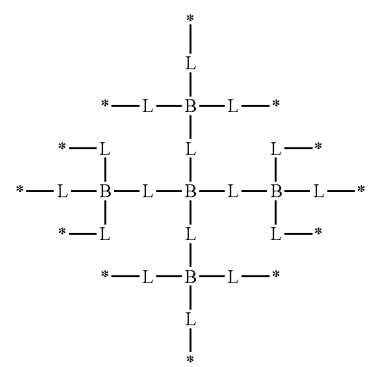

-continued

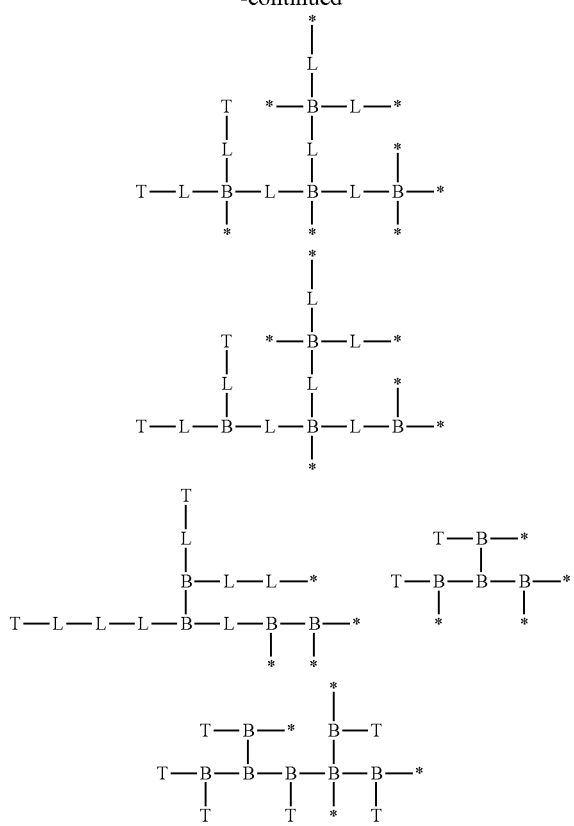

(Structural Unit B)

The structural unit B is a trivalent or higher-valent structural unit constituting a branch portion in a case where the charge transporting polymer has a branched structure. The charge transporting polymer may have only one kind of structural unit B, or may have two or more kinds thereof. The structural unit B is preferably hexavalent or less and is more preferably trivalent or tetravalent from the viewpoint of improving durability of an organic electronic element. Examples of the structural unit B include a trivalent or higher-valent structural unit (1) (hereinafter, may be referred to as a "structural unit B1"), and a structural unit not including the structure (1) (hereinafter, may be referred to as a "structural unit B2").

The structural unit B2 is preferably a structural unit having charge transportability, and is more preferably a structural unit having hole transportability. The structural unit B2 is not particularly limited, but from the viewpoint of improving durability of an organic electronic element, the structural unit B2 is selected from, for example, an aromatic amine structure, a carbazole structure, a fused polycyclic aromatic hydrocarbon structure, and a structure containing one or two or more of these structures (where these structures are substituted or unsubstituted). The aromatic amine structure is preferably a structure selected from the group consisting of a diarylamine structure and a triarylamine structure, is more preferably a triarylamine structure, and is even more preferably a triphenylamine structure.

Specific examples of the structural unit B2 include the following structural units. The structural unit B2 is not limited to the following examples.

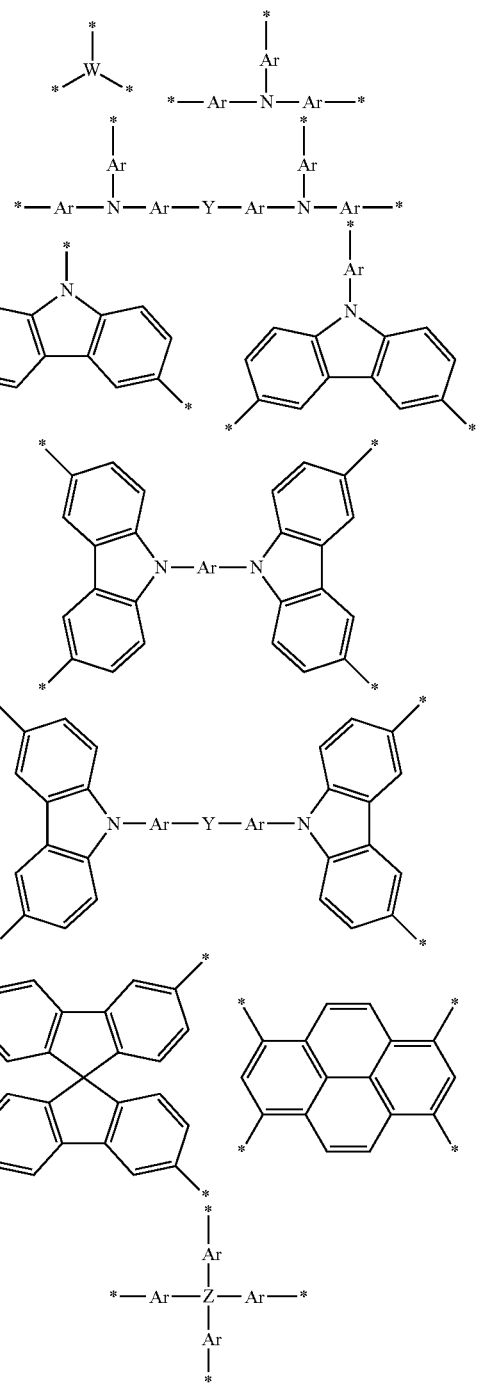

W represents a trivalent linking group, and represents, for example, an arenetriyl group or a heteroarenetriyl group having 2 to 30 carbon atoms.

Ar's each independently represent a divalent linking group, and each independently represent, for example, an arylene group or a heteroarylene group. Ar is preferably an arylene group or a heteroarylene group having 2 to 30 carbon atoms, is more preferably an arylene group having 2 to 30 carbon atoms, and is even more preferably a phenylene group.

Y represents a direct bond or a divalent linking group, and examples thereof include a divalent group obtained by further removing one hydrogen atom from a group having one or more hydrogen atoms among the above-mentioned substituents X (where a group having a polymerizable functional group is excluded).

Z represents any one of a carbon atom, a silicon atom, or a phosphorus atom.

In the structural units, W, a benzene ring, and Ar may have a substituent, and examples of substituents include the above-mentioned substituent X.

In the present specification, an arylene group is an atomic group obtained by removing two hydrogen atoms from an aromatic hydrocarbon. A heteroarylene group is an atomic group obtained by removing two hydrogen atoms from an aromatic heterocyclic compound. An arenetriyl group is an atomic group obtained by removing three hydrogen atoms from an aromatic hydrocarbon. A heteroarenetriyl group is an atomic group obtained by removing three hydrogen atoms from an aromatic heterocyclic compound. The descriptions regarding aromatic hydrocarbons and aromatic heterocyclic compounds in an aryl group and a heteroaryl group also apply to aromatic hydrocarbons and aromatic heterocyclic compounds in these groups.

(Structural Unit L)

A structural unit L is a divalent structural unit. The charge transporting polymer may have only one kind of structural unit L, or may have two or more kinds thereof. Examples of the structural unit L include a divalent or higher-valent structural unit (1) (hereinafter, may be referred to as a "structural unit L1"), and a structural unit not including the structure (1) (hereinafter, may be referred to as a "structural unit L2").

The structural unit L2 is preferably a structural unit having charge transportability, and is more preferably a structural unit having hole transportability. The structural unit having charge transportability is not particularly limited as long as it contains an atomic group having an ability to transport charges. For example, the structural unit L2 is selected from an aromatic amine structure, a carbazole structure, a thiophene structure, a fluorene structure, a benzene structure, a biphenyl structure, a terphenyl structure, a naphthalene structure, an anthracene structure, a tetracene structure, a phenanthrene structure, a dihydrophenanthrene structure, a pyridine structure, a pyrazine structure, a quinoline structure, an isoquinoline structure, a quinoxaline structure, an acridine structure, a diazaphenanthrene structure, a furan structure, a pyrrole structure, an oxazole structure, an oxadiazole structure, a thiazole structure, a thiadiazole structure, a triazole structure, a benzothiophene structure, a benzoxazole structure, a benzoxadiazole structure, a benzothiazole structure, a benzothiadiazole structure, a benzotriazole structure, and a structure containing one or two or more of these structures (where these structures are substituted or unsubstituted). The aromatic amine structure is preferably a structure selected from the group consisting of a diarylamine structure and a triarylamine structure, is more preferably a triarylamine structure, and is even more preferably a triphenylamine structure. The structural unit L2 may have the same structure as the structural unit B2 except for the valence, or may have a different structure therefrom.

In one embodiment, from the viewpoint of obtaining excellent hole transportability, the structural unit L2 is preferably selected from an aromatic amine structure, a carbazole structure, a thiophene structure, a fluorene structure, a benzene structure, a pyrrole structure, an aniline structure, a phenoxazine structure, and a structure containing one or two or more of these structures (where these structures are substituted or unsubstituted), is more preferably selected from an aromatic amine structure, a carbazole structure, a thiophene structure, a fluorene structure, a benzene structure, a pyrrole structure, and a structure containing one or two or more of these structures (where these structures are substituted or unsubstituted), is even more preferably selected from an aromatic amine structure, a carbazole structure, a thiophene structure, a pyrrole structure, and a structure containing one or two or more of these structures (where these structures are substituted or unsubstituted), and is particularly preferably selected from an aromatic amine structure, a carbazole structure, and a structure containing one or two or more of these structures (where these structures are substituted or unsubstituted). In another embodiment, from the viewpoint of obtaining excellent electron transportability, the structural unit L2 is preferably selected from a fluorene structure, a benzene structure, a phenanthrene structure, a pyridine structure, a quinoline structure, and a structure containing one or two or more of these structures (where these structures are substituted or unsubstituted).

Specific examples of the structural unit L2 include the following structural units. The structural unit L2 is not limited to the following examples.

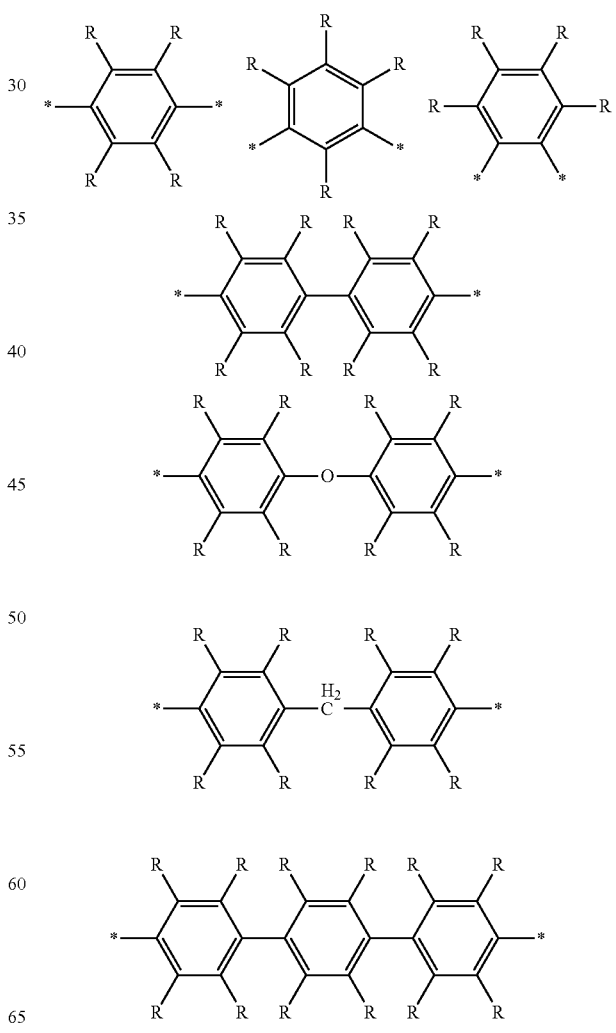

-continued
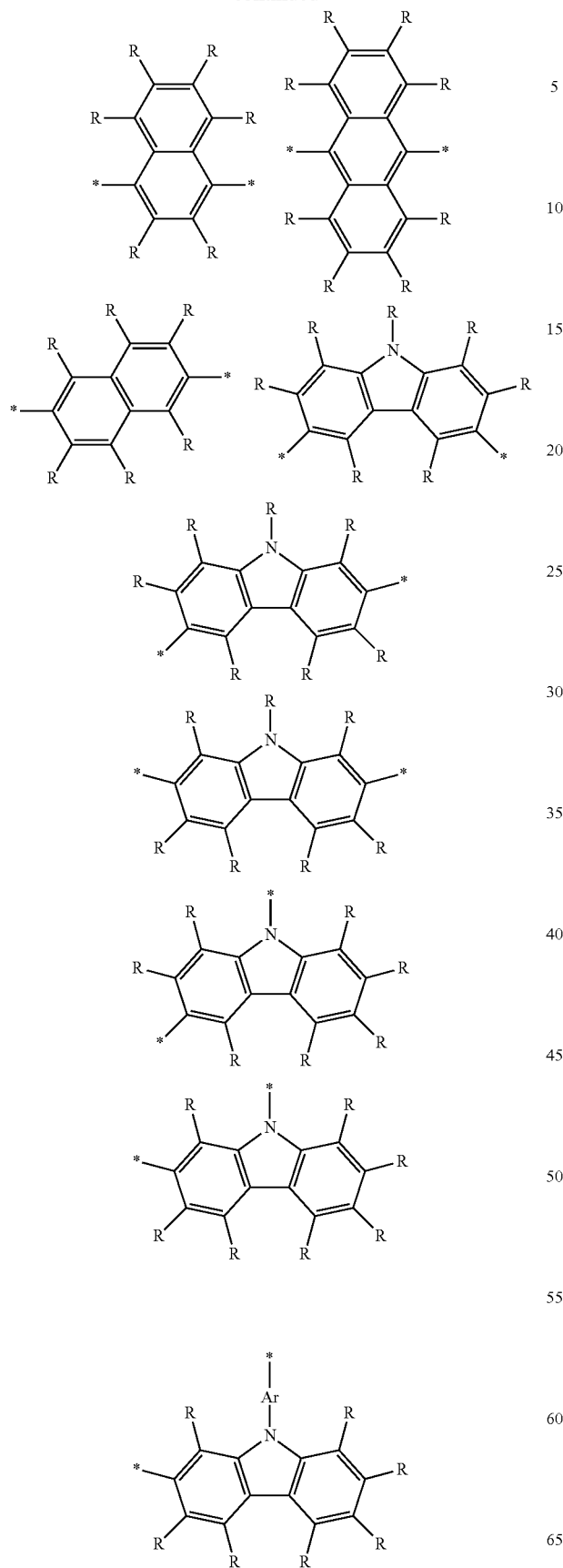
-continued
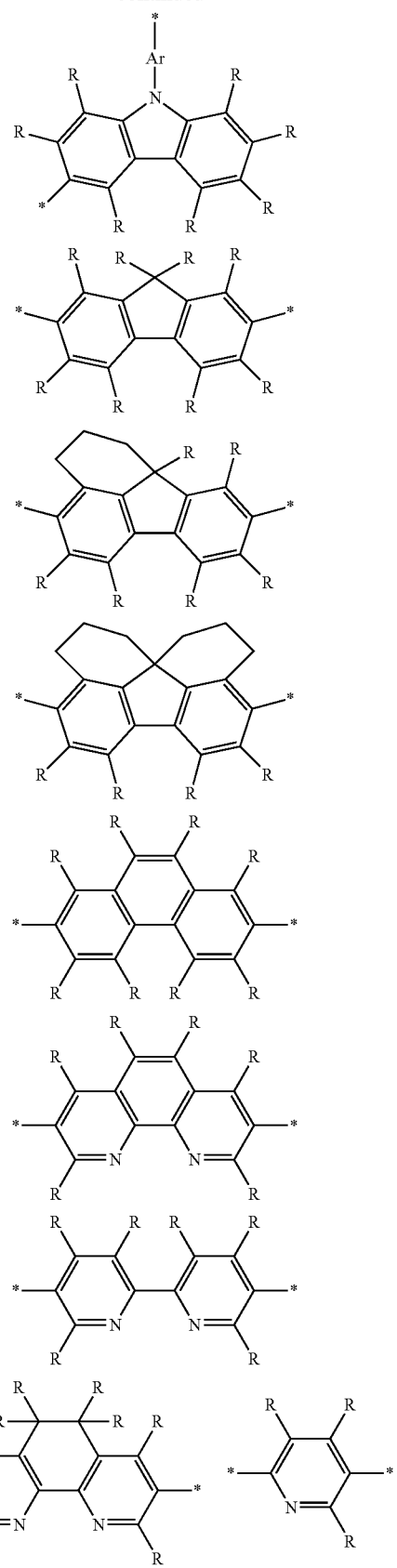

-continued
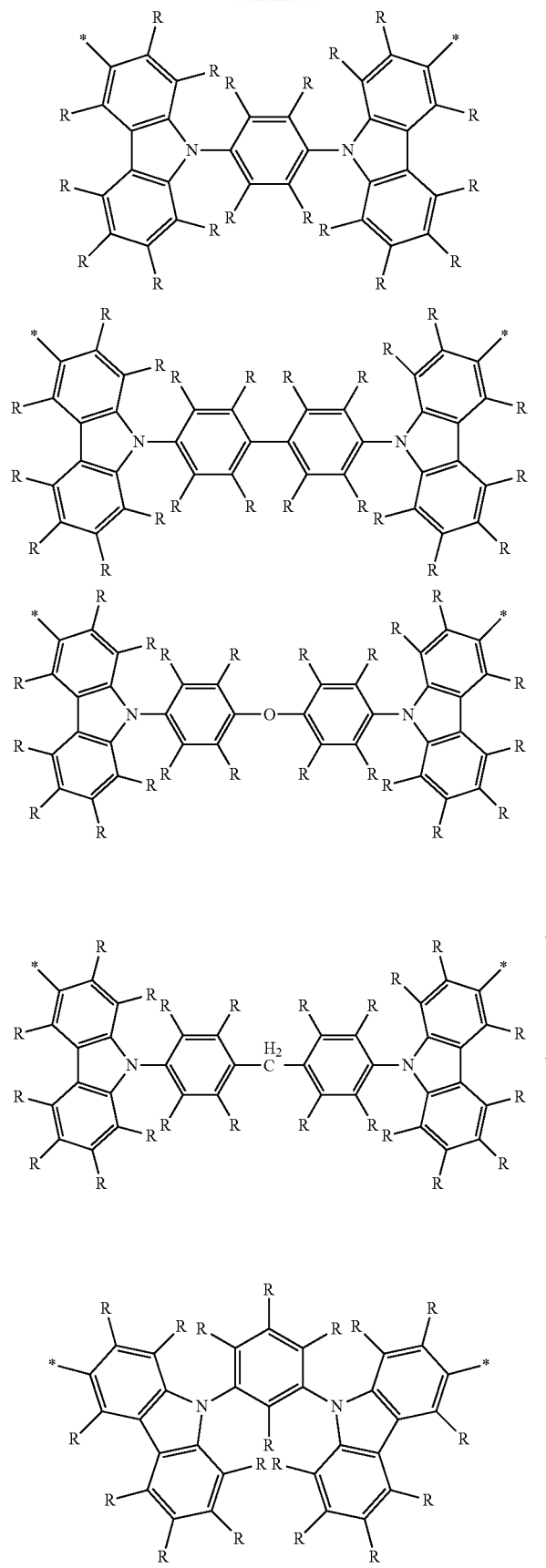
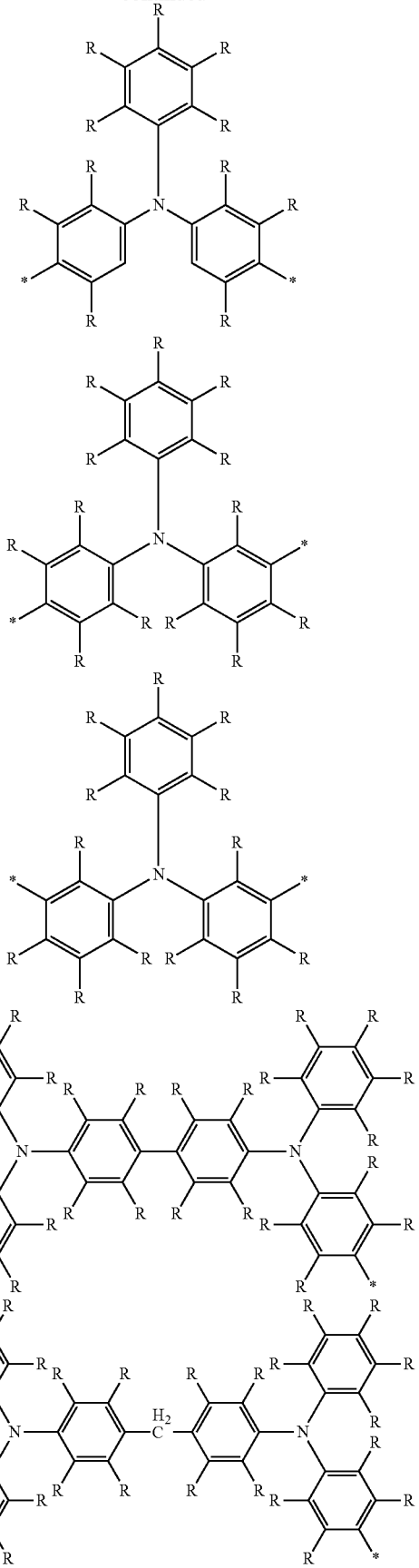

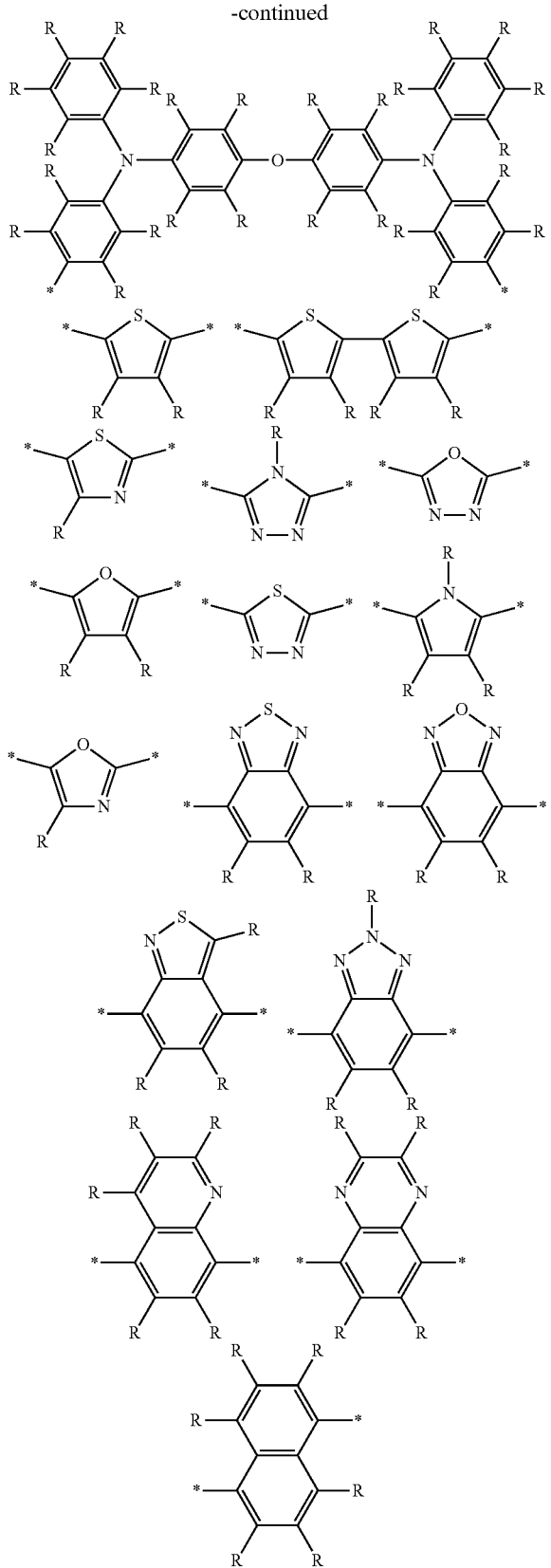

In the formulas, R's each independently represent a hydrogen atom or a substituent. Examples of substituents include the above-mentioned substituent X. R is preferably a hydrogen atom, an alkyl group, an aryl group, an alkyl-substituted aryl group, a halogen atom, a halogen-substituted alkyl group, or the like.

Ar's each independently represent a divalent linking group, and each independently represent, for example, an arylene group or a heteroarylene group. Ar is preferably an arylene group or a heteroarylene group having 2 to 30 carbon atoms, is more preferably an arylene group having 2 to 30 carbon atoms, and is even more preferably a phenylene group.

(Structural Unit T)

A structural unit T is a monovalent structural unit constituting a terminal portion of the charge transporting polymer. The charge transporting polymer may have only one kind of structural unit T, or may have two or more kinds thereof. In a case where the charge transporting polymer has a polymerizable functional group at a terminal portion, the structural unit T has a group having a polymerizable functional group. Examples of the structural unit T include a monovalent structural unit (1) (hereinafter, may be referred to as a "structural unit T1"), and a structural unit not including the structure (1) (hereinafter, may be referred to as a "structural unit T2").

The structural unit T2 is preferably a structural unit having charge transportability, and is more preferably a structural unit having hole transportability. The structural unit T2 is not particularly limited, and is selected from, for example, an aromatic hydrocarbon structure, an aromatic heterocyclic structure, and a structure containing one or two or more of these structures (where these structures are substituted or unsubstituted). From the viewpoint of imparting durability without reducing charge transportability, the structural unit T2 is preferably a substituted or unsubstituted aromatic hydrocarbon structure, and is more preferably a substituted or unsubstituted benzene structure. The structural unit T2 may have the same structure as the structural unit L2 except for the valence, or may have a different structure therefrom. The structural unit T2 may have the same structure as the structural unit B2 except for the valence, or may have a different structure therefrom.

Specific examples of the structural unit T2 include the following structural units. The structural unit T2 is not limited to the following examples.

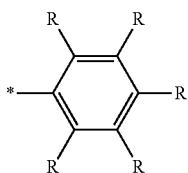

In the formula, R's each independently represent a hydrogen atom or a substituent. Examples of substituents include the above-mentioned substituent X. R is preferably a hydrogen atom, an alkyl group, a halogen-substituted alkyl group, a group having a polymerizable functional group, or the like. In a case where the charge transporting polymer has a polymerizable functional group at a terminal portion, the structural unit T preferably has a structural unit in which at least one of R's in the above formula is a group having a polymerizable functional group. The structural unit T preferably has a structural unit in which at least one of R's in the above formula is an alkyl group or a fluoroalkyl group in order to improve solubility of the charge transporting polymer in a solvent and charge transportability of an organic layer. An alkyl group is preferably a linear alkyl group, is more preferably a linear alkyl group having 20 or less carbon atoms, and is even more preferably a linear alkyl group having 6 to 12 carbon atoms. A fluoroalkyl group is preferably a perfluoroalkyl group, is more preferably a perfluoromethyl group or a perfluoroethyl group, and is even more preferably a perfluoromethyl group.

(Polymerizable Functional Group)

In one embodiment, the charge transporting polymer preferably has at least one polymerizable functional group from the viewpoint that then, the charge transporting polymer is cured by a polymerization reaction, and thereby solubility in a solvent is changed. The "polymerizable functional group" refers to a functional group capable of forming a bond with each other by being applied with heat, light, or the like. The polymerizable functional group may be contained in the structural unit (1), or may be contained in a structural unit other than the structural unit (1).

Examples of polymerizable functional groups include a group having a carbon-carbon multiple bond (for example, a vinyl group, a styryl group, an allyl group, a butenyl group, an ethynyl group, an acryloyl group, an acryloyloxy group, an acryloylamino group, a methacryloyl group, a methacryloyloxy group, a methacryloylamino group, a vinyloxy group, a vinylamino group, and the like), a group having a small ring (for example, a cyclic alkyl group such as a cyclopropyl group, a benzocyclobutenyl group, and a cyclobutyl group; a group having a cyclic ether structure such as an epoxy group (oxylanyl group) and an oxetane group (oxetanyl group); a diketene group; an episulfide group; a lactone group; a lactam group; and the like), a heterocyclic group (for example, a furan-yl group, a pyrrole-yl group, a thiophene-yl group, a silole-yl group, and the like), and the like (where these groups are substituted or unsubstituted).

A substituent in a case where these groups are substituted is not particularly limited, and examples thereof include a linear, cyclic, or branched alkyl group. The number of carbon atoms of an alkyl group is preferably 1 to 22, is more preferably 1 to 10, and is even more preferably 1 to 4.

The polymerizable functional group is preferably a group having a cyclic ether structure or a group having a carbon-carbon multiple bond (where these groups are substituted or unsubstituted), and is more preferably a vinyl group, a styryl group, an acryloyl group, a methacryloyl group, an epoxy group, or an oxetane group (where these groups are substituted or unsubstituted). From the viewpoint of reactivity and characteristics of an organic electronic element, the polymerizable functional group is even more preferably a vinyl group, an oxetane group, or an epoxy group (where these groups are substituted or unsubstituted).

A skeletal structure of the charge transporting polymer, and the polymerizable functional group may be bonded to each other via a linking group such as an alkylene chain (for example, a linear alkylene chain having 1 to 8 carbon atoms), from the viewpoint of increasing a degree of freedom of the polymerizable functional group and facilitating a polymerization reaction. In a case where an alkylene chain is included, a solubility of the charge transporting polymer in a solvent is also likely to be improved. Furthermore, for example, in a case where an organic layer is formed on an electrode, a skeletal structure of the charge transporting polymer, and the polymerizable functional group may be bonded to each other via a hydrophilic link such as an ethylene glycol chain and a diethylene glycol chain, from the viewpoint of improving affinity for a hydrophilic electrode such as ITO. Furthermore, a linking group containing one or more selected from an ether bond, an ester bond, and the like may be provided between the skeletal structure and the polymerizable functional group, from the viewpoint of facilitating preparation of a monomer used to introduce the polymerizable functional group.

Meanwhile, in a case where a linking group such as an alkylene chain, an ethylene glycol chain, and a diethylene glycol chain is not included, heat resistance of an organic layer is likely to increase.

Examples of the above-mentioned "group having a polymerizable functional group" include a "polymerizable functional group" itself, and a "group in which a polymerizable functional group and a linking group such as an alkylene chain or an ether bond are combined". As the group having a polymerizable functional group, it is possible suitably to use, for example, a group exemplified in PCT International Publication No. WO2010/140553.

The polymerizable functional group may be introduced at a terminal portion of the charge transporting polymer (that is, a structural unit T), may be introduced at a part other than the terminal portion (that is, a structural unit B or L), and may be introduced at both the terminal portion and the part other than the terminal portion. The polymerizable functional group is preferably introduced at least at the terminal portion from the viewpoint of curing properties, and it is preferably introduced only at the terminal portion from the viewpoint of achieving both curing properties and charge transportability. Furthermore, the polymerizable functional group may be introduced into a main chain or a side chain of the charge transporting polymer, or may be introduced into both the main chain and the side chain thereof.

The polymerizable functional group is preferably contained in a large amount in the charge transporting polymer from the viewpoint of contributing to change in solubility. On the other hand, an amount contained in the charge transporting polymer is preferably small from the viewpoint of not hindering charge transportability. A content of the polymerizable functional group can be appropriately set in consideration of these points.

For example, the number of polymerizable functional groups per molecule of the charge transporting polymer is preferably 2 or more, and is more preferably 3 or more, from the viewpoint of obtaining a sufficient change in solubility and facilitating multi-layering. In addition, the number of polymerizable functional groups is preferably 1,000 or less, is more preferably 500 or less, and is even more preferably 300 or less, from the viewpoint of maintaining charge transportability.

The number of polymerizable functional groups per molecule of the charge transporting polymer can be obtained as an average value using a feed amount of polymerizable functional groups (for example, a feed amount of monomers having a polymerizable functional group) used for synthesizing the charge transporting polymer, a feed amount of monomers corresponding to each of structural units, a weight-average molecular weight of the charge transporting polymer, and the like. In addition, the number of polymerizable functional groups can be calculated as an average value using a ratio of an integral value of a signal derived from the polymerizable functional group in the $^1$H NMR (nuclear magnetic resonance) spectrum of the charge transporting polymer to an integral value in the full spectrum, a weight-average molecular weight of the charge transporting polymer, and the like.

(Number Average Molecular Weight)

A number average molecular weight of the charge transporting polymer can be appropriately adjusted in consideration of solubility in a solvent, film forming properties, and the like. A number average molecular weight is preferably 500 or more, is more preferably 1,000 or more, is even more preferably 2,000 or more, and is particularly preferably 5,000 or more, from the viewpoint of excellent charge transportability. In addition, a number average molecular weight is preferably 1,000,000 or less, is more preferably 100,000 or less, is even more preferably 50,000 or less, and is particularly preferably 30,000 or less, from the viewpoint of maintaining favorable solubility in a solvent and facilitating preparation of a liquid composition.

(Weight-Average Molecular Weight)

A weight-average molecular weight of the charge transporting polymer can be appropriately adjusted in consideration of solubility in a solvent, film forming properties, and the like. A weight-average molecular weight is preferably 1,000 or more, is more preferably 5,000 or more, and is even more preferably 10,000 or more, from the viewpoint of excellent charge transportability. In addition, a weight-average molecular weight is preferably 1,000,000 or less, is more preferably 700,000 or less, is even more preferably 400,000 or less, and is particularly preferably 100,000 or less, from the viewpoint of maintaining favorable solubility in a solvent and facilitating preparation of a liquid composition.

A number average molecular weight and a weight-average molecular weight can be measured by gel permeation chromatography (GPC) using a calibration curve for standard polystyrenes. Examples of measurement conditions include conditions described in examples.

(Ratio of Structural Units)

A ratio of the structural unit (1) included in the charge transporting polymer is preferably 5 mol % or more, is more preferably 7 mol % or more, and is even more preferably 10 mol % or more based on all structural units from the viewpoint of improving solubility and improving charge transportability. An upper limit thereof is not particularly limited and is 100 mol % or less. For example, in a case where the charge transporting polymer further has a structural unit having hole transportability, a ratio of the structural unit (1) is preferably 50 mol % or less, is more preferably 30 mol % or less, and is even more preferably 20 mol % or less.

In a case where the charge transporting polymer has a structural unit having hole transportability, a ratio of a structural unit having hole transportability is preferably 50 mol % or more, is more preferably 70 mol % or more, and is even more preferably 80 mol % or more based on all structural units from the viewpoint of improving hole transportability of an organic layer. An upper limit thereof is less than 100 mol %.

A ratio of the structural unit B included in the charge transporting polymer is preferably 1 mol % or more, is more preferably 5 mol % or more, and is even more preferably 10 mol % or more based on all structural units from the viewpoint of improving durability of an organic electronic element. In addition, a ratio of the structural unit B is preferably 50 mol % or less, is more preferably 40 mol % or less, is even more preferably 30 mol % or less, and is particularly preferably 20 mol % or less from the viewpoint of suppressing an increase in viscosity and satisfactorily synthesizing the charge transporting polymer, or from the viewpoint of obtaining sufficient charge transportability.

In a case where the charge transporting polymer has the structural unit L, a ratio of the structural unit L is preferably 10 mol % or more, is more preferably 15 mol % or more, and is even more preferably 20 mol % or more based on all structural units from the viewpoint of obtaining sufficient charge transportability. In addition, a ratio of the structural unit L is preferably 95 mol % or less, is more preferably 90 mol % or less, and is even more preferably 85 mol % or less in consideration of the structural unit T and the structural unit B.

A ratio of the structural unit T included in the charge transporting polymer is preferably 5 mol % or more, is more preferably 10 mol % or more, and is even more preferably 15 mol % or more based on all structural units from the viewpoint of improving characteristics of an organic electronic element, or from the viewpoint of suppressing an increase in viscosity and satisfactorily synthesizing the charge transporting polymer. In addition, a ratio of the structural unit T is preferably 60 mol % or less, is more preferably 55 mol % or less, and is even more preferably 50 mol % or less from the viewpoint of obtaining sufficient charge transportability.

In a case where the charge transporting polymer has a polymerizable functional group, a ratio of the polymerizable functional group is preferably 0.1 mol % or more, is more preferably 1 mol % or more, and is even more preferably 3 mol % or more based on all structural units from the viewpoint of efficiently curing the charge transporting polymer. In addition, a ratio of the polymerizable functional group is preferably 70 mol % or less, is more preferably 60 mol % or less, and is even more preferably 50 mol % or less from the viewpoint of obtaining favorable charge transportability. The "ratio of the polymerizable functional group" referred to herein means a ratio of a structural unit having a polymerizable functional group.

The charge transporting polymer preferably has the structural unit L, the structural unit T, and the structural unit B in consideration of a balance between charge transportability, durability, productivity, and the like. A ratio (molar ratio) of the structural unit L, the structural unit T, and the structural unit B is preferably L:T:B=100:10 to 400:10 to 300, is more preferably 100:20 to 300:5 to 200, and is even more preferably 100:40 to 200:10 to 100.

A ratio of the structural units can be obtained using a feed amount of monomers corresponding to each of the structural units used for synthesizing the charge transporting polymer. Furthermore, a ratio of the structural units can be calculated as an average value using an integral value of a spectrum derived from each of the structural units in the $^1$H NMR spectrum of the charge transporting polymer. In a case where a feed amount is clear, it is preferable to adopt a value obtained using the feed amount, because it is simple.

Preferred examples of charge transporting polymers are described below. The charge transporting polymer preferably satisfies the following (1) or (2).

(1) Charge transporting polymer having at least a structural unit B1, a structural unit L2, and a structural unit T2

(2) Charge transporting polymer having at least a structural unit B2, a structural unit L1, and a structural unit T2

(3) Charge transporting polymer having at least a structural unit B2, a structural unit L2, and a structural unit T1

In (1) to (3), it is preferable that the structural unit L2 and the structural unit B2 be each independently a structural unit having hole transportability, and it is more preferable that the structural unit L2 and the structural unit B2 be each independently a structural unit having at least one structure selected from the group consisting of a substituted or unsubstituted aromatic amine structure and a substituted or unsubstituted carbazole structure.

In (1) to (3), the structural unit T2 is preferably a structural unit having a substituted or unsubstituted aromatic hydrocarbon structure, and is more preferably a structural unit having a substituted or unsubstituted benzene structure.

A degree of polymerization (number of units of structural units) of the charge transporting polymer is 2 or more, and from the viewpoint of stabilizing film quality of an organic layer, it is preferably 5 or more, is more preferably 10 or more, and is even more preferably 20 or more. In addition, a degree of polymerization is preferably 1,000 or less, is more preferably 700 or less, and is even more preferably 500 or less from the viewpoint of solubility in a solvent.

A degree of polymerization can be obtained as an average value using a weight-average molecular weight of the charge transporting polymer, a molecular weight of a structural unit, and a proportion of a structural unit.

(Manufacturing Method)

The charge transporting polymer can be manufactured by various synthetic methods, and a method is not particularly limited. For example, it can be manufactured by allowing a polymerization reaction of monomers for forming structural units included in the charge transporting polymer. The charge transporting polymer is preferably a copolymer of a monomer mixture containing at least a monomer having the structural unit (1) and a monomer having a structural unit having hole transportability. Examples of monomer mixtures include a monomer mixture containing a monomer having the structural unit B1, a monomer having the structural unit L2, and a monomer having the structural unit T2; a monomer mixture containing a monomer having the structural unit B2, a monomer having the structural unit L1, and a monomer having the structural unit T2; and the like. A monomer mixture may optionally contain one or more monomers other than the above-mentioned monomers.

A ratio of the monomer having the structural unit (1) in the monomer mixture is preferably 5 mol % or more, is more preferably 7 mol % or more, and is even more preferably 10 mol % or more based on all monomers in the monomer mixture from the viewpoint of improving characteristics of an organic electronic element. An upper limit thereof is not particularly limited and is 100 mol % or less. For example, in a case where the monomer mixture further contains any of the monomer having the structural unit B2, the monomer having the structural unit L2, and the monomer having the structural unit T2, a ratio of the structural unit (1) is preferably 50 mol % or less, is more preferably 30 mol % or less, and is even more preferably 20 mol % or less.

In a case where the monomer mixture contains the monomer having the structural unit having hole transportability, a ratio of the monomer having the structural unit having hole transportability is preferably 50 mol % or more, is more preferably 70 mol % or more, and is even more preferably 80 mol % or more based on all monomers in the monomer mixture from the viewpoint of improving hole transportability of an organic layer. An upper limit thereof is not particularly limited and is less than 100 mol %.

The charge transporting polymer can be easily manufactured by copolymerizing monomers in a case where a monomer mixture is used. A form of a copolymer may be an alternating, random, block, or graft copolymer, or may be a copolymer having a structure having intermediate characteristics of the above copolymers, for example, a random copolymer having blocking properties.

The polymerization reaction is preferably a coupling reaction. As a coupling reaction, for example, it is possible to use known reactions such as Suzuki coupling, Negishi coupling, Sonogashira coupling, Stille coupling, and Buchwald-Hartwig coupling. Suzuki coupling causes a cross-coupling reaction between an aromatic boronic acid compound and an aromatic halide using a Pd catalyst. According to Suzuki coupling, the charge transporting polymer can be easily manufactured by bonding desired aromatic rings to each other.

In a coupling reaction, for example, a Pd(0) compound, a Pd(II) compound, a Ni compound, and the like are used as a catalyst. Furthermore, it is possible to use a catalyst species generated by mixing tris(dibenzylideneacetone)dipalladium (0), palladium(II) acetate, or the like as a precursor with a phosphine ligand. For a method of synthesizing the charge transporting polymer, for example, the description of PCT International Publication No. WO2010/140553 can be referred to.

Examples of monomers that can be used in the Suzuki coupling reaction include the following monomers.

(Monomer B)

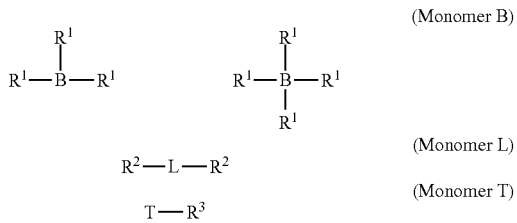

In the formulas, B represents a trivalent or tetravalent structural unit, L represents a divalent structural unit, and T represents a monovalent structural unit. $R^1$ to $R^3$ represent functional groups capable of forming bonds with each other, and for example, $R^1$ to $R^3$ each independently represent any one selected from the group consisting of a boronic acid group, a boronic acid ester group, and a halogen group. A monomer used has the structural unit (1) as at least one of "B," "L," and "T."

These monomers can be synthesized by a known method. In addition, these monomers are available from, for example, Tokyo Chemical Industry Co., Ltd., Sigma-Aldrich Japan, and the like.

[Dopant]

The organic electronic material may contain an arbitrary additive, and may further contain, for example, a dopant. The dopant is not particularly limited as long as it can exhibit a doping effect and improve charge transportability by being added to the organic electronic material. Doping includes p-type doping and n-type doping. In the p-type doping, a substance that acts as an electron acceptor is used as a dopant, and in the n-type doping, a substance that acts as an electron donor is used as a dopant. The p-type doping is preferable for improving hole transportability, and the n-type doping is preferable for improving electron transportability. The dopant used in the organic electronic material may be a dopant that exhibits any effect of the p-type doping or the n-type doping. Furthermore, one kind of dopant may be added alone, or a plurality of kinds of dopants may be mixed and added.

The dopant used for the p-type doping is an electron-accepting compound, and examples thereof include Lewis acids, protonic acids, transition metal compounds, ionic compounds, halogen compounds, π-conjugated compound, and the like. Specific examples are as follows. Examples of Lewis acids include $FeCl_3$, $PF_5$, $AsF_5$, $SbF_5$, $BF_5$, $BCl_3$, $BBr_3$, and the like. Examples of protonic acids include inorganic acids such as HF, HCl, HBr, $HNO_3$, $H_2SO_4$, and $HClO_4$, and organic acids such as benzenesulfonic acid, p-toluenesulfonic acid, dodecylbenzenesulfonic acid, polyvinyl sulfonic acid, methanesulfonic acid, trifluoromethanesulfonic acid, trifluoroacetic acid, 1-butane sulfonic acid, vinyl phenyl sulfonic acid, and camphorsulfonic acid. Examples of transition metal compounds include FeOCl, $TiCl_4$, $ZrCl_4$, $HfCl_4$, $NbF_5$, $AlCl_3$, $NbCl_5$, $TaCl_5$, and $MoF_5$. Examples of ionic compounds include salts having perfluoroanions such as tetrakis(pentafluorophenyl)borate ion, tris(trifluoromethanesulfonyl)methide ion, bis(trifluoromethanesulfonyl)imide ion, hexafluoroantimonate ion, hexafluoroarsenate ion ($AsF_6^-$), tetrafluoroborate ion ($BF_4^-$), and hexafluorophosphate ion ($PF_6^-$), salts having a conjugate base of the above-mentioned protonic acid as anions, and the like. Examples of halogen compounds include $Cl_2$, $Br_2$, $I_2$, ICl, $ICl_3$, IBr, IF, and the like. Examples of π-conjugated compounds include tetracyanoethylene (TCNE), tetracyanoquinodimethane (TCNQ), and the like. It is also possible to use known electron-accepting compounds other than the above examples. Lewis acids, ionic compounds, π-conjugated compounds, and the like are preferable.

The dopant used for the n-type doping is an electron-donating compound, and examples thereof include alkali metals such as Li and Cs; alkaline earth metal such as Mg and Ca; alkali metals such as LiF and $Cs_2CO_3$; and/or alkaline earth metal salts; metal complexes; electron-donating organic compounds; and the like.

In a case where the charge transporting polymer has a polymerizable functional group, it is preferable to use a compound that can act as a polymerization initiator for the polymerizable functional group as a dopant in order to facilitate change in solubility of an organic layer.

[Other Optional Components]

The organic electronic material may further contain a charge transporting low-molecular-weight compound, other polymers, and the like.

[Content]

A content of the charge transporting polymer in the organic electronic material is preferably 50% by mass or more, is more preferably 70% by mass or more, and is even more preferably 80% by mass or more with respect to a total mass of the organic electronic material from the viewpoint of obtaining favorable charge transportability. An upper limit of the content of the charge transporting polymer is not particularly limited, and it may be 100% by mass. A content of the charge transporting polymer may be, for example, 95% by mass or less or 90% by mass or less in consideration of incorporation of an additive such as a dopant.

In a case where the dopant is contained, a content thereof is preferably 0.01% by mass or more, is more preferably 0.1% by mass or more, and is even more preferably 0.5% by mass or more with respect to a total mass of the organic electronic material from the viewpoint of improving charge transportability of the organic electronic material. Furthermore, a content is preferably 50% by mass or less, is more preferably 30% by mass or less, and is even more preferably 20% by mass or less with respect to a total mass of the organic electronic material from the viewpoint of maintaining favorable film forming properties.

<Liquid Composition>

A liquid composition according to the embodiment of the present invention contains the above-described organic electronic material and a solvent. In a case where the liquid composition contains a solvent, an organic layer can be easily formed by a simple method such as a coating method. The liquid composition can be used as an ink composition.

[Solvent]

As the solvent, it is possible to use an arbitrary solvent such as water, an organic solvent, or a mixed solvent thereof. Examples of organic solvents include alcohols such as methanol, ethanol, and isopropyl alcohol; alkanes such as pentane, hexane, and octane; cyclic alkanes such as cyclohexane; aromatic hydrocarbons such as benzene, toluene, xylene, mesitylene, tetralin, and diphenylmethane; aliphatic ethers such as ethylene glycol dimethyl ether, ethylene glycol diethyl ether, and propylene glycol-1-monomethyl ether acetate; aromatic ethers such as 1,2-dimethoxybenzene, 1,3-dimethoxybenzene, anisole, phenetol, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; amides such as N,N-dimethylformamide and N,N-dimethylacetamide; dimethyl sulfoxide; tetrahydrofuran; acetone; chloroform; methylene chloride; and the like. Aromatic hydrocarbons, aliphatic esters, aromatic esters, aliphatic ethers, and aromatic ethers are preferable, and aromatic hydrocarbons are more preferable.

[Polymerization Initiator]

In a case where the charge transporting polymer has a polymerizable functional group, the liquid composition preferably contains a polymerization initiator. As the polymerization initiator, it is possible to use known radical polymerization initiators, cationic polymerization initiators, anionic polymerization initiators, and the like. It is preferable to use a substance having both a function as a dopant and a function as a polymerization initiator from the viewpoint that the liquid composition can be then easily prepared. Examples of such substances include the above-mentioned ionic compounds.

[Additive]

The liquid composition may further contain an additive as an optional component. Examples of additives include polymerization inhibitors, stabilizers, thickeners, gelling agents, flame retardants, antioxidants, reduction inhibitors, oxidizing agents, reducing agents, surface modifiers, emulsifiers, defoamers, dispersants, surfactants, and the like.

[Content]

A content of the solvent in the liquid composition can be determined in consideration of application to various coating methods. For example, a content of the solvent at which a ratio of the charge transporting polymer to the solvent becomes 0.1% by mass or more is preferable, a content of the solvent at which a ratio of the charge transporting polymer to the solvent becomes 0.2% by mass or more is more preferable, and a content of the solvent at which a ratio of the charge transporting polymer to the solvent becomes 0.5% by mass or more is even more preferable. In addition, a content of the solvent at which a ratio of the charge transporting polymer to the solvent becomes 20% by mass or less is preferable, a content of the solvent at which a ratio of the charge transporting polymer to the solvent becomes 15% by mass or less is more preferable, and a content of the solvent at which a ratio of the charge transporting polymer to the solvent becomes 10% by mass or less is even more preferable.

<Organic Layer>

An organic layer according to the embodiment of the present invention is a layer formed using the above-described organic electronic material or liquid composition. The organic layer exhibits favorable charge transportability. The organic layer can be formed favorably and easily by a coating method in a case of using the liquid composition.

Examples of coating methods include known method such as a spin coating method; a casting method; a dipping method; a plate printing method such as relief printing, intaglio printing, offset printing, flat plate printing, letterpress reversal offset printing, screen printing, and gravure printing; and a plateless printing method such as an inkjet printing method. In a case where the organic layer is formed by a coating method, a coating layer obtained after coating may be dried by a heat treatment to remove the solvent.

In a case where the charge transporting polymer has a polymerizable functional group, it is possible to cause a polymerization reaction of the charge transporting polymer to proceed by light irradiation, heat treatment, or the like, and thereby solubility of the coating layer can be changed. The heat treatment is preferable because it is simple. By laminating the organic layer obtained by changing solubility of the coating layer, it is possible to easily realize multi-layering of an organic electronic element.

The heat treatment can be carried out in an air atmosphere or an inert gas atmosphere. Examples of inert gases include helium gas, argon gas, nitrogen gas, and a mixed gas thereof. Regarding the "inert gas atmosphere," an atmosphere in which a concentration of an inert gas is 99.5% or more in terms of volume ratio is preferable, an atmosphere in which a concentration of an inert gas is 99.9% or more in terms of volume ratio is more preferable, and an atmosphere in which a concentration of an inert gas is 99.99% or more in terms of volume ratio is even more preferable.

The heat treatment can be carried out using, for example, a heater such as a hot plate or an oven. In order to carry out the heat treatment in the inert gas atmosphere, for example, a hot plate is used in the inert gas atmosphere, or an atmosphere of the inside of an oven is made inert gas atmosphere.

The heat treatment is preferably carried out at a temperature equal to or higher than a boiling point of the solvent from the viewpoint of efficiently removing the solvent. Furthermore, in a case where a polymerization reaction of the charge transporting polymer is caused to proceed, a temperature at which the polymerization reaction proceeds efficiently is preferable. In one embodiment, a temperature for the heat treatment is preferably 140° C. or higher, is more preferably 180° C. or higher, and is even more preferably 190° C. or higher. Meanwhile, from the viewpoint of inhibiting a deterioration due to the heat treatment, a temperature is preferably 300° C. or lower, is more preferably 280° C. or lower, and is even more preferably 250° C. or lower.

A thickness of the organic layer after drying or curing is preferably 0.1 nm or more, is more preferably 1 nm or more, and is even more preferably 3 nm or more from the viewpoint of improving efficiency of charge transport. In addition, a thickness of the organic layer is preferably 300 nm or less, is more preferably 200 nm or less, and is even more preferably 100 nm or less from the viewpoint of reducing electric resistance.

<Organic Electronic Element>

An organic electronic element according to the embodiment of the present invention includes at least one organic layer described above. Examples of organic electronic elements include an organic EL element, an organic photoelectric conversion element, an organic transistor, and the like. The organic electronic element preferably has a structure in which an organic layer is disposed between at least a pair of electrodes. The organic electronic element can be manufactured by a manufacturing method including forming an organic layer using the above-described organic electronic material or the above-described liquid composition.

<Organic EL Element>

An organic EL element according to the embodiment of the present invention includes at least one organic layer described above. The organic EL element generally includes a light emitting layer, an anode, a cathode, and a substrate. As necessary, the organic EL element includes other functional layers such as a hole injection layer, an electron injection layer, a hole transport layer, and an electron transport layer. Each of the layers may be formed by a vapor deposition method or a coating method. The organic EL element preferably includes the above-described organic layer as a light emitting layer or another functional layer, more preferably includes the above-described organic layer as another functional layer, and even more preferably includes the above-described organic layer as at least one of a hole injection layer and a hole transport layer.

FIG. 1 is a schematic cross-sectional view showing one embodiment of the organic EL element. The organic EL element of FIG. 1 is an element having a multilayer structure, and includes a substrate 8, an anode 2, a hole injection layer 3, a hole transport layer 6, a light emitting layer 1, an electron transport layer 7, an electron injection layer 5, and a cathode 4 in this order.

[Light Emitting Layer]

As a material used for the light emitting layer, it is possible to use a fluorescent material such as low-molecular-weight compounds, polymers, or dendrimers. Polymers are preferred because they are highly soluble in solvents and suitable for coating methods. Examples of fluorescent materials include fluorescent materials, phosphorescent materials, thermally activated delayed fluorescence (TADF) materials, and the like.

Examples of fluorescent materials include low-molecular-weight compounds such as perylene, coumarin, rubrene, quinacridone, stilbene, dye for dye laser, aluminum complex, and derivatives thereof; polymers such as polyfluorene, polyphenylene, polyphenylene vinylene, polyvinylcarbazole, fluorene-benzothiazol copolymer, fluorene-triphenylamine copolymers, and derivatives thereof; mixtures thereof; and the like.

As the phosphorescent material, a metal complex containing a metal such as Ir or Pt can be used. Examples of Ir complexes include FIr(pic) (iridium(III) bis[(4,6-difluorophenyl)-pyridinato-N,$C^2$]picolinate) which emits blue light; Ir(ppy)$_3$ (fac-tris(2-phenylpyridine) iridium) which emits green light; (btp)$_2$Ir(acac) (bis[2-(2'-benzo[4,5-a]thienyl) pyridinato-N,$C^3$]iridium(acetyl-acetonate)) which emits red light, and Ir(piq)$_3$ (tris(1-phenylisoquinoline)iridium) which emits red light; and the like. Examples of Pt complexes include 2,3,7,8,12,13,17,18-octaethyl-21H,23H-porphyrin platinum (PtOEP) which emits red light, and the like.

In a case where the light emitting layer contains a phosphorescent material, it is preferable to further incorporate a host material in addition to the phosphorescent material. As the host material, it is possible to use low-molecular-weight compounds, polymers, or dendrimers. Examples of low-molecular-weight compounds include 4,4'-bis(9H-carbazole-9-yl)biphenyl (CBP), 1,3-bis(9-carbazolyl)benzene (mCP), 4,4'-bis(carbazole-9-yl)-2,2'-dimethylbiphenyl (CDBP), derivatives thereof, and the like. Examples of polymers include the above-described organic electronic material, polyvinylcarbazole, polyphenylene, polyfluorene, derivatives thereof, and the like.

Examples of thermally activated delayed fluorescence materials include such compounds as 2-biphenyl-4,6-bis(12-phenylindolo[2,3-a]carbazol-11-yl)-1,3,5-triazine (PIC-TRZ), 2',7'-bis(di-p-tolylamino)-9,9'-spirobifluorene-s, 7-dicarbonitrile (Spiro-CN), 2,4-bis {3-(9H-carbazol-9-yl)-9H-carbazol-9-yl}-6-phenyl-1,3,5-triazine (CC2TA), 9,9'-(4,4'-sulfonylbis(4,1-phenylene))bis(3,6-di-tert-butyl-9H-carbazole) (CZ-PS), 3,4,5,6-tetra(9H-carbazol-9-yl) phthalonitrile (4CzPN), 4,4',4''-(1,3,3a$^1$,4,6,7,9-heptaazaphenalene-2,5,8-triyl)tris(N,N-bis(4-(tert-butyl) phenyl) aniline) (HAP-3TPA), and 1,2,3,5-tetrakis(carbazol-9-yl)-4,6-dicyanobenzene (4CzIPN).

[Hole Injection Layer and Hole Transport Layer]

It is preferable to use the organic layer as at least one of a hole injection layer and a hole transport layer. As described above, these layers can be easily formed by using the liquid composition containing the organic electronic material and the solvent.

In a case where the organic EL element includes the above-described organic layer as a hole injection layer and further includes a hole transport layer, a known material can be used for the hole transport layer. Furthermore, in a case where the organic EL element includes the above-described organic layer as a hole transport layer and further includes a hole injection layer, a known material can be used for the hole injection layer. Both the hole injection layer and the hole transport layer may be the above-described organic layer. Examples of known materials include aromatic amine compounds (for example, aromatic diamines such as N,N'-di(naphthalene-1-yl)-N,N'-diphenyl-benzidine (α-NPD)), phthalocyanine compounds, thiophene compounds (for example, a thiophene-based conductive polymer such as poly(3,4-ethylenedioxythiophene):poly(4-styrene sulfonate) (PEDOT:PSS)), and the like.

In a case where the hole transport layer is an organic layer obtained after changing solubility, a light emitting layer can be easily formed on an upper layer of the hole transport layer by a wet-type process. In this case, a polymerization initiator may be contained in the organic layer which serves as the hole transport layer, or may be contained in an organic layer which is a lower layer of the hole transport layer.

[Electron Transport Layer and Electron Injection Layer]

Examples of materials used for an electron transport layer and an electron injection layer include phenanthroline derivatives, bipyridine derivatives, nitro-substituted fluorene derivatives, diphenylquinone derivatives, thiopyrandioxide derivatives, fused rings such as naphthalene and perylene, tetracarboxylic anhydrides, carbodiimides, fluorenylidene methane derivatives, anthraquinodimethane and anthrone derivatives, oxadiazole derivatives, thiadiazole derivatives, benzimidazole derivatives, quinoxalin derivatives, aluminum complexes, and the like. Furthermore, it is also possible use the above-mentioned organic electronic material.

[Cathode]

As a cathode material, for example, a metal such as Li, Ca, Mg, Al, In, Cs, Ba, Mg/Ag, LiF, and CsF, or a metal alloy is used.

[Anode]

As an anode material, for example, a metal (for example, Au) or another material having conductivity is used. Examples of other materials include oxides (such as ITO: indium oxide/tin oxide), and conductive polymers (such as polythiophene-polystyrene sulfonic acid mixture (PEDOT:PSS)).

[Substrate]

As the substrate, it is possible to use glass, plastic, and the like. The substrate is preferably transparent and preferably has flexibility. Quartz glass, resin films, and the like are preferably used.

As the resin film, a light transmitting resin film is preferable. Examples of resin films include films mainly formed of the following substances: polyethylene terephthalate, polyethylene naphthalate, polyether sulfone, polyetherimide, polyetheretherketone, polyphenylene sulfide, polyarylate, polyimide, polycarbonate, cellulose triacetate, cellulose acetate propionate, and the like.

In a case where the resin film is used, the resin film may be used after being coated with an inorganic substance such as silicon oxide or silicon nitride in order to inhibit permeation of water vapor, oxygen, and the like.

[Sealing]

The organic EL element may be sealed in order to reduce the influence of the outside air and prolong the lifespan. As a material used for sealing, it is possible to use glass, plastic films such as epoxy resin, acrylic resin, polyethylene terephthalate, and polyethylene naphthalate, or inorganic substances such as silicon oxide or silicon nitride, but the material is not limited thereto. A sealing method is not particularly limited, and a known method can be used.

[Emission Color]

An emission color of the organic EL element is not particularly limited. A white organic EL element is preferable because it can be used for various lighting fixtures such as household lighting, vehicle interior lighting, clocks, and liquid crystal backlights.

As a method of forming a white organic EL element, it is possible to use a method including emitting a plurality of emission colors at the same time using a plurality of fluorescent materials and mixing the colors. A combination of a plurality of emission colors is not particularly limited, and examples thereof include a combination containing three emission maximum wavelengths of blue, green, and red; a combination containing two maximum emission wavelengths of blue and yellow, yellowish green and orange, or the like; and the like. An emission color can be controlled by adjusting the type and amount of a fluorescent material.

<Display Element, Lighting Device, and Display Device>

A display element according to the embodiment of the present invention includes the above-described organic EL element. For example, a color display element can be obtained using an organic EL element as an element corresponding to each pixel of red, green, and blue (RGB). Examples of methods of forming an image include a simple matrix type in which electrodes disposed in a matrix shape directly drive individual organic EL elements arranged on a panel, and an active matrix type in which each element is driven by disposing a thin film transistor.

Furthermore, the lighting device according to the embodiment of the present invention includes the above-described organic EL element. Furthermore, the display device according to the embodiment of the present invention includes the lighting device, and a liquid crystal element as a display means. For example, the display device can be a display device in which, the lighting device is used as a backlight and a known liquid crystal element is used as a display means, that is, a liquid crystal display device.

Examples of Embodiments

Examples of the preferred embodiments of the present invention are described below. The embodiments of the present invention are not limited to the following examples.

[1] An organic electronic material including a charge transporting polymer which has a branched structure and has a structural unit having a structure represented by Formula (1).

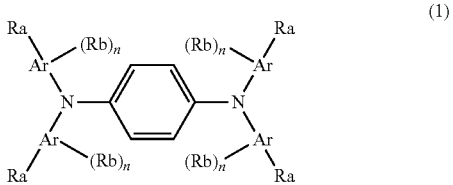
(1)

(In the formula, Ar's each independently represent an aromatic ring group, Ra's each independently represent a hydrogen atom, a substituent, or a binding site with another structure, Rb's each independently represent a substituent, and n's each independently represent an integer of 0 or more, where at least one of Ra's is a binding site with another structure).

[2] The organic electronic material according to [1], in which the structure represented by Formula (1) includes at least one selected from the group consisting of a structure represented by Formula (1B-1) and a structure represented by Formula (1L-1).

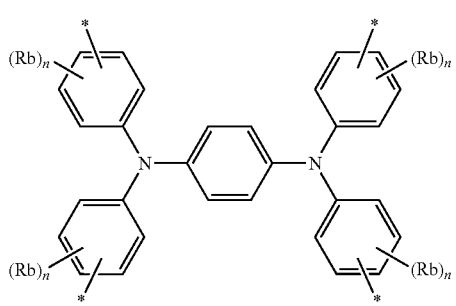
(1B-1)

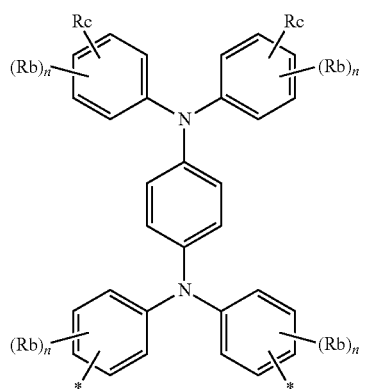
(1L-1)

(In the formulas, * represents a binding site with another structure, Rc's each independently represent a hydrogen atom or a substituent, Rb's each independently represent a substituent, and n's each independently represent an integer of 0 to 4).

[3] The organic electronic material according to [1] or [2], in which the charge transporting polymer further has a structural unit having at least one structure selected from the group consisting of an aromatic amine structure, a carbazole structure, a thiophene structure, a fluorene structure, a benzene structure, a pyrrole structure, an aniline structure, and a phenoxazine structure.

[4] The organic electronic material according to any one of [1] to [3], in which the charge transporting polymer has at least one polymerizable functional group.

[5] The organic electronic material according to [4], further including a polymerization initiator.

[6] The organic electronic material according to any one of [1] to [5], in which the charge transporting polymer is a hole transporting polymer.

[7] A liquid composition including: the organic electronic material according to any one of [1] to [6]; and a solvent.

[8] An organic layer which is formed using the organic electronic material according to any one of [1] to [6] or the liquid composition according to [7].

[9] An organic electronic element comprising the organic layer according to [8].

[10] An organic electroluminescent element comprising the organic layer according to [8].

[11] An organic electroluminescent element comprising the organic layer according to [8] as a hole injection layer or a hole transport layer.

[12] A display element comprising the organic electroluminescent element according to [10] or [11].

[13] A lighting device comprising the organic electroluminescent element according to [10] or [11].

[14] A display device including: the lighting device according to [13]; and a liquid crystal element as a display means.

[15] A method for manufacturing an organic electronic element, the method comprising forming an organic layer using the organic electronic material according to any one of [1] to [6] or the liquid composition according to [7].

Examples

Hereinafter, the present invention will be described in more detail with reference to examples. The present invention is not limited to the following examples.

<Preparation of Charge Transporting Polymer>

[Preparation of Pd Catalyst]

Tris(dibenzylideneacetone)dipalladium (73.2 mg, 80 µmol) was weighed into a sample tube at room temperature in a glove box under a nitrogen atmosphere, toluene (15 mL) was added thereto, and the mixture was stirred for 30 minutes. In the same manner, tris(t-butyl)phosphine (129.6 mg, 640 µmol) was weighed into a sample tube, toluene (5 mL) was added thereto, and the mixture was stirred for 5 minutes. These solutions were mixed and stirred at room temperature for 30 minutes, and thereby a catalytic solution (hereinafter referred to as a "Pd catalytic solution") was obtained. In the preparation of the Pd catalyst, all solvents were used after degassing with nitrogen bubbles for 30 minutes or longer.

[Preparation of Charge Transporting Polymer]

Charge transporting polymers 1 to 14 were prepared as follows.

(Charge Transporting Polymer 1)

A monomer A1 (4.0 mmol), a monomer B1 (1.0 mmol), a monomer C1 (4.0 mmol), methyltri-n-octylammonium chloride ("Aliquat 336" manufactured by Alfa Aesar) (0.03 g), potassium hydroxide (1.12 g), pure water (5.54 mL), and toluene (15 mL) were added in a three-neck round-bottom flask, and the Pd catalytic solution (1.0 mL) was further added thereto and mixed. The obtained mixed solution was heated to reflux for 2 hours. All operations up to this point were performed under a nitrogen stream. In addition, all solvents were used after degassing with nitrogen bubbles for 30 minutes or longer.

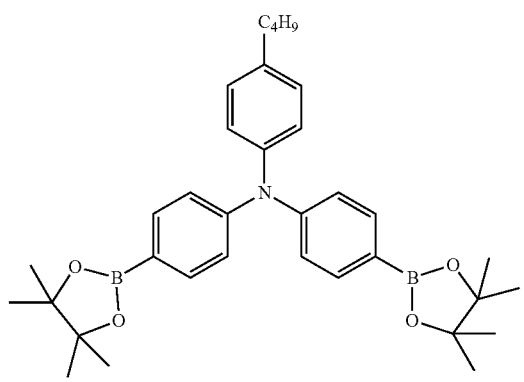

A1

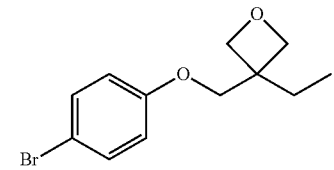

B1

C1

After completion of the reaction, an organic layer was washed with water, and the organic layer was poured into methanol-water (9:1). The resulting precipitate was recovered by suction filtration and washed with methanol-water (9:1). The obtained precipitate was dissolved in toluene and reprecipitated from methanol. The obtained precipitate was recovered by suction filtration and dissolved in toluene. A metal adsorbent ("Triphenylphosphine, polymer-bound on styrene-divinylbenzene copolymer" manufactured by Strem Chemicals, Inc., 200 mg per 100 mg of the precipitate) was added thereto, and the mixture was stirred at 80° C. for 2 hours. After the stirring was completed, the metal adsorbent and the insoluble matter were removed by filtration, and then reprecipitation from methanol was performed. The resulting precipitate was recovered by suction filtration and washed with methanol. The obtained precipitate was vacuum dried, and thereby a charge transporting polymer 1 was obtained. The charge transporting polymer 1 had a number average molecular weight of 9,200 and a weight-average molecular weight of 38,200.

The number average molecular weight and the weight-average molecular weight were measured by GPC (polystyrene conversion) using tetrahydrofuran (THF) as an eluent. Measurement conditions were as follows.

Device: Prominence high-performance liquid chromatograph manufactured by Shimadzu Corporation
Liquid delivering pump (LC-20AD)
Degassing unit (DGU-20A)
Autosampler (SIL-20AHT)
Column oven (CTO-20A)
PDA detector (SPD-M20A)
Differential refractometer (RID-20A)
Column: Gelpack (registered trademark)
GL-A160S (product number: 686-1J27)
GL-A150S (product number: 685-1J27) manufactured by Hitachi Chemical Co., Ltd.
Eluent: tetrahydrofuran (THF) (for HPLC, containing stabilizer) manufactured by FUJIFILM Wako Pure Chemical Corporation
Flow velocity: 1 mL/min
Column temperature: 40° C.
Detection wavelength: 254 nm
Molecular weight standard substance: PStQuick A/B/C manufactured by TOSOH CORPORATION (Charge Transporting Polymer 2)

A monomer A2 (4.0 mmol), a monomer B1 (1.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 2 was obtained. The charge transporting polymer 2 had a number average molecular weight of 12,100 and a weight-average molecular weight of 49,000.

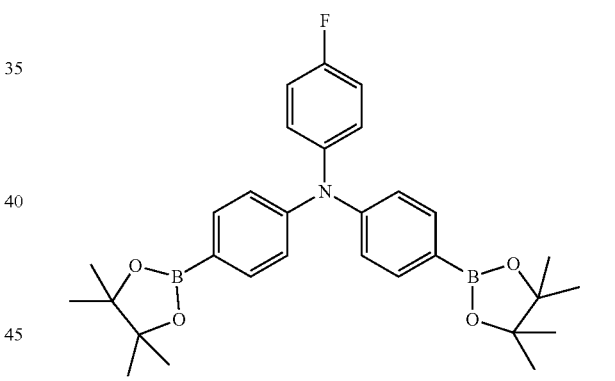

A2

B1

C1

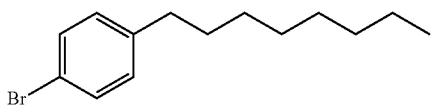

(Charge Transporting Polymer 3)

A monomer A2 (4.0 mmol), a monomer B1 (1.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 3 was obtained. The charge transporting polymer 3 had a number average molecular weight of 18,700 and a weight-average molecular weight of 48,000.

(Charge Transporting Polymer 4)

A monomer A2 (4.0 mmol), a monomer B1 (1.0 mmol), a monomer C2 (2.0 mmol), a monomer C4 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 4 was obtained. The charge transporting polymer 4 had a number average molecular weight of 12,100 and a weight-average molecular weight of 48,600.

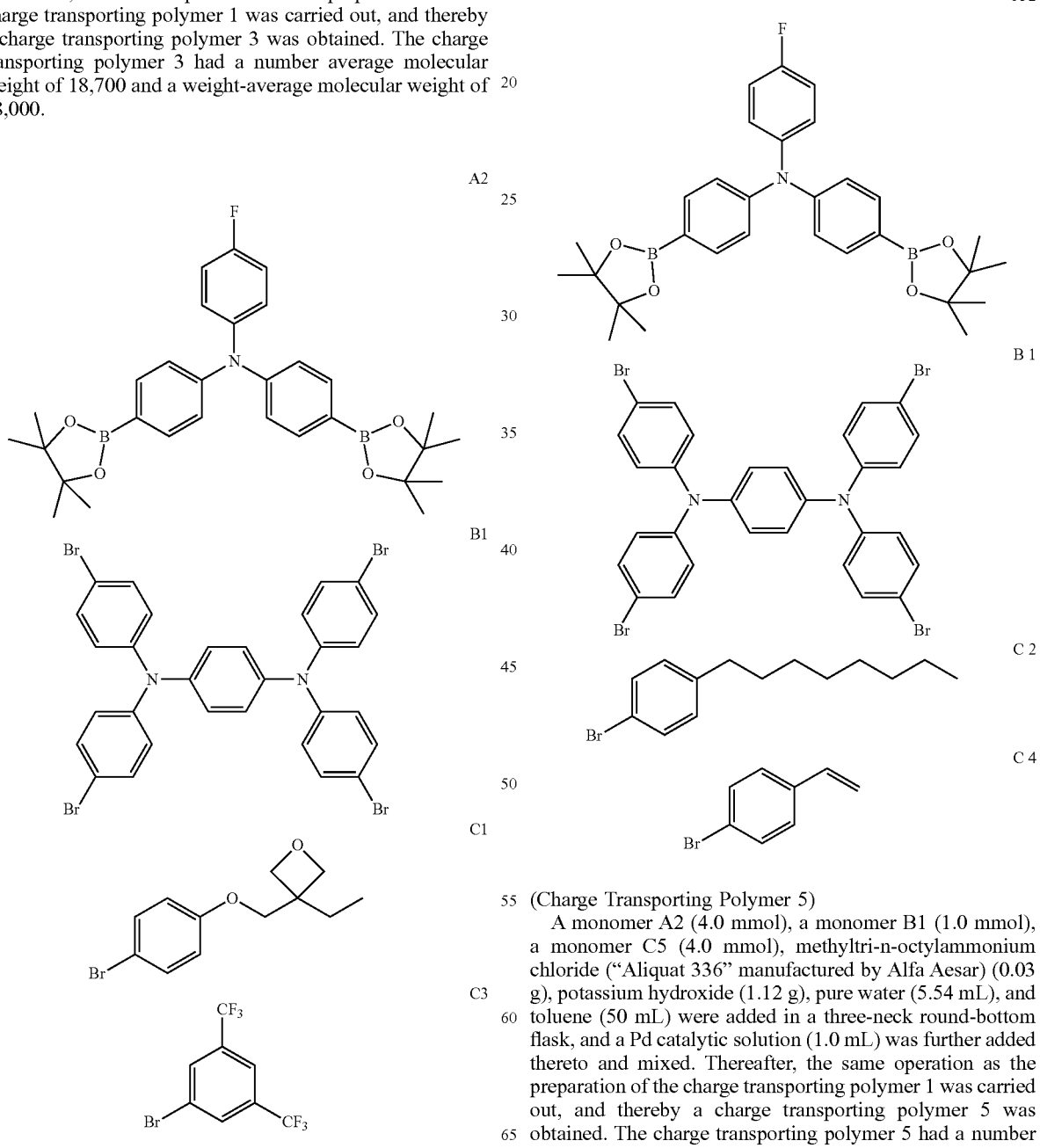

(Charge Transporting Polymer 5)

A monomer A2 (4.0 mmol), a monomer B1 (1.0 mmol), a monomer C5 (4.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 5 was obtained. The charge transporting polymer 5 had a number average molecular weight of 15,000 and a weight-average molecular weight of 43,200.

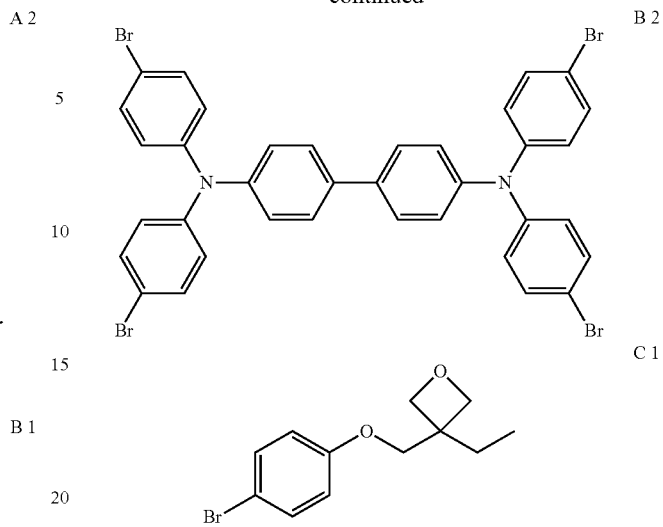

A2

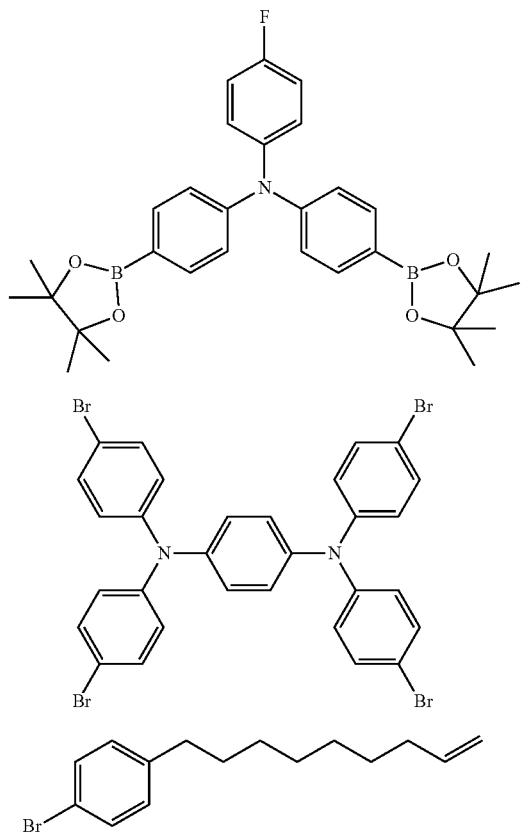

B1

(Charge Transporting Polymer 6)

A monomer A1 (4.0 mmol), a monomer B2 (1.0 mmol), a monomer C1 (4.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 6 was obtained. The charge transporting polymer 6 had a number average molecular weight of 17,700 and a weight-average molecular weight of 59,000.

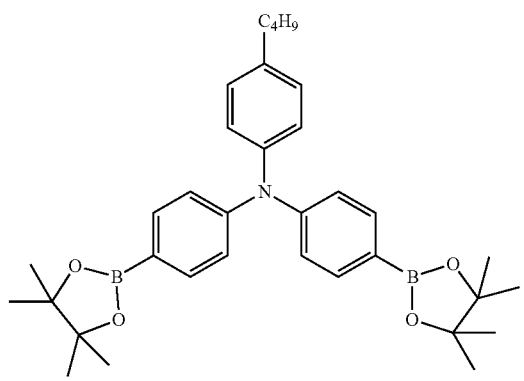

A2

B2

C1

(Charge Transporting Polymer 7)

A monomer A2 (4.0 mmol), a monomer B2 (1.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 7 was obtained. The charge transporting polymer 7 had a number average molecular weight of 12,100 and a weight-average molecular weight of 63,900.

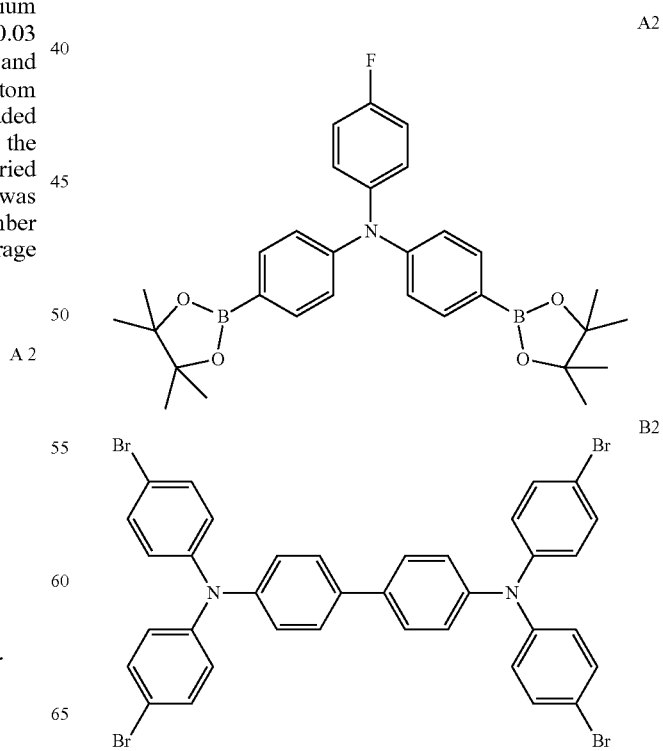

A2

B2

C1

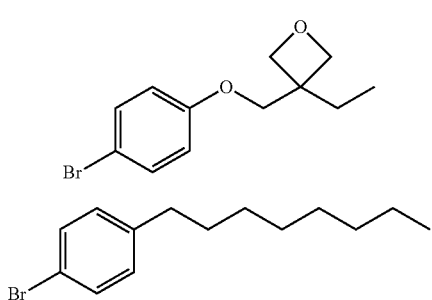

C2

(Charge Transporting Polymer 8)

A monomer A2 (4.0 mmol), a monomer B2 (1.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 8 was obtained. The charge transporting polymer 8 had a number average molecular weight of 15,100 and a weight-average molecular weight of 56,500.

A2

B2

C1

C3

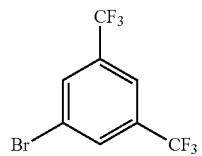

(Charge Transporting Polymer 9)

A monomer A2 (4.0 mmol), a monomer B2 (1.0 mmol), a monomer C2 (2.0 mmol), a monomer C4 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 9 was obtained. The obtained charge transporting polymer 9 had a number average molecular weight of 13,700 and a weight-average molecular weight of 60,800.

A2

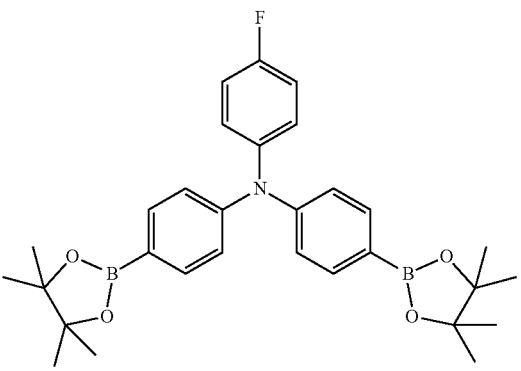

B2

C2

C4

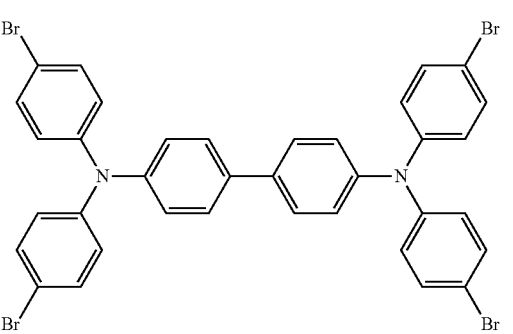

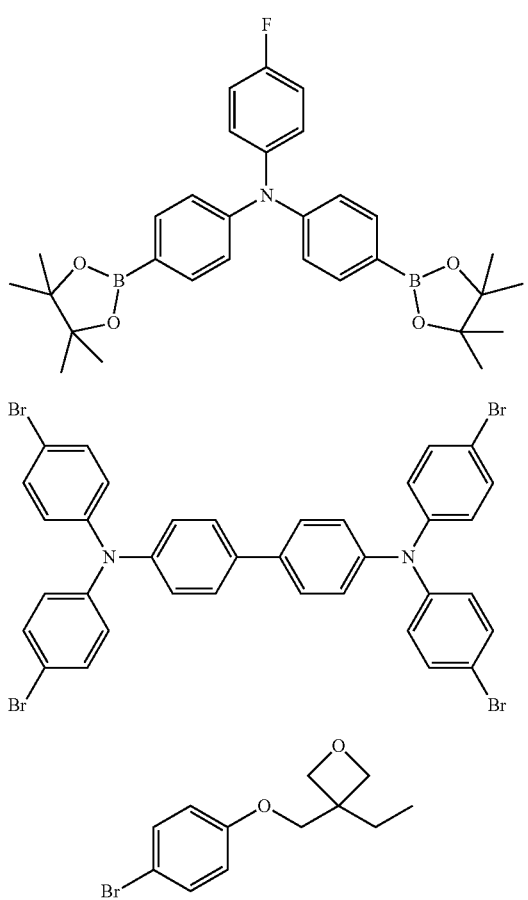

(Charge Transporting Polymer 10)

A monomer A2 (4.0 mmol), a monomer B2 (1.0 mmol), a monomer C5 (4.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 10 was obtained. The obtained charge transporting polymer 10 had a number average molecular weight of 20,000 and a weight-average molecular weight of 55,900.

A3

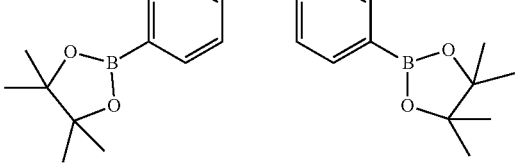

B3

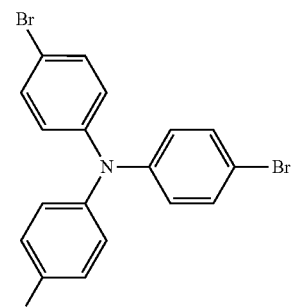

C1

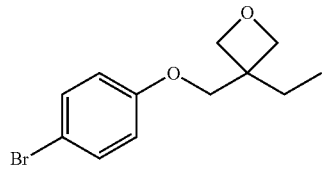

C2

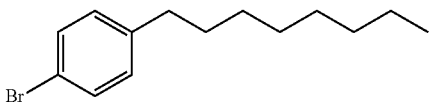

A2

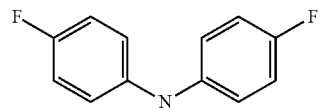

B2

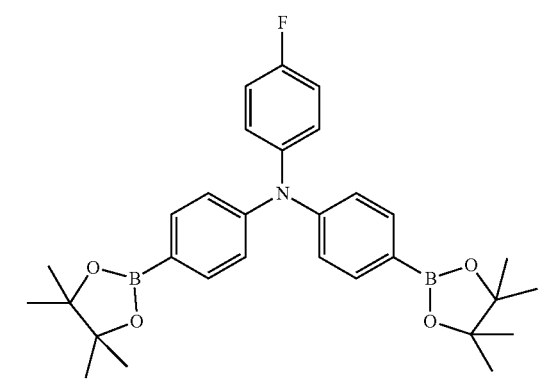

C5

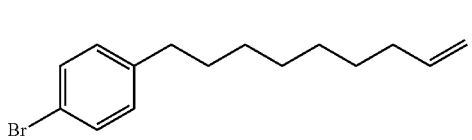

(Charge Transporting Polymer 11)

A monomer A3 (5.0 mmol), a monomer B3 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 11 was obtained. The charge transporting polymer 11 had a number average molecular weight of 14,700 and a weight-average molecular weight of 51,000.

(Charge transporting polymer 12)

A monomer A4 (5.0 mmol), a monomer B3 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 12 was obtained. The charge transporting polymer 12 had a number average molecular weight of 13,900 and a weight-average molecular weight of 42,300.

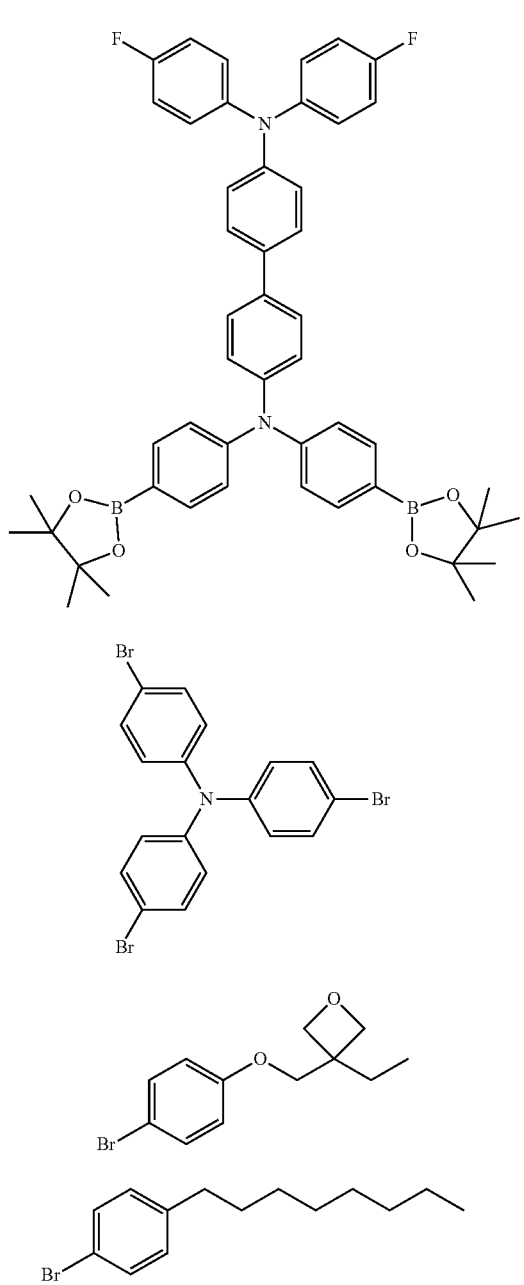

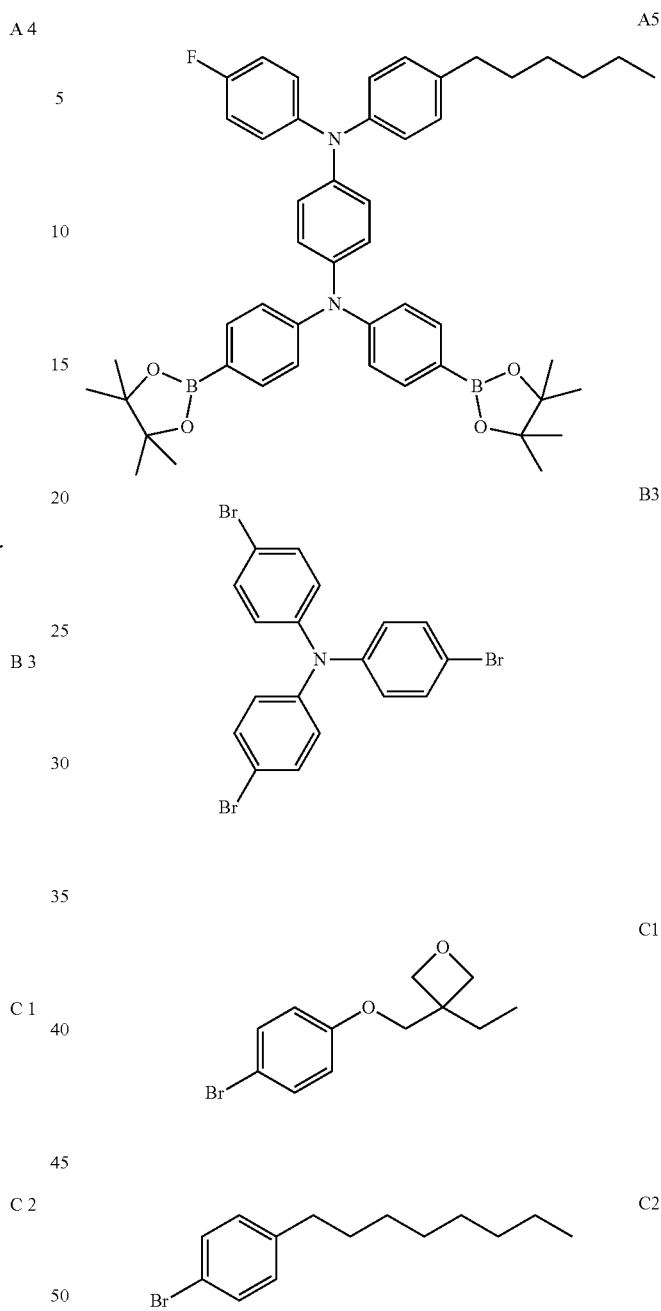

(Charge Transporting Polymer 13)

A monomer A5 (5.0 mmol), a monomer B3 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 13 was obtained. The charge transporting polymer 13 had a number average molecular weight of 19,900 and a weight-average molecular weight of 50,900.

(Charge Transporting Polymer 14)

A monomer A6 (5.0 mmol), a monomer B3 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and a Pd catalytic solution (1.0 mL) was further added thereto and mixed. Thereafter, the same operation as the preparation of the charge transporting polymer 1 was carried out, and thereby a charge transporting polymer 14 was obtained. The charge transporting polymer 14 had a number average molecular weight of 14,700 and a weight-average molecular weight of 61,600.

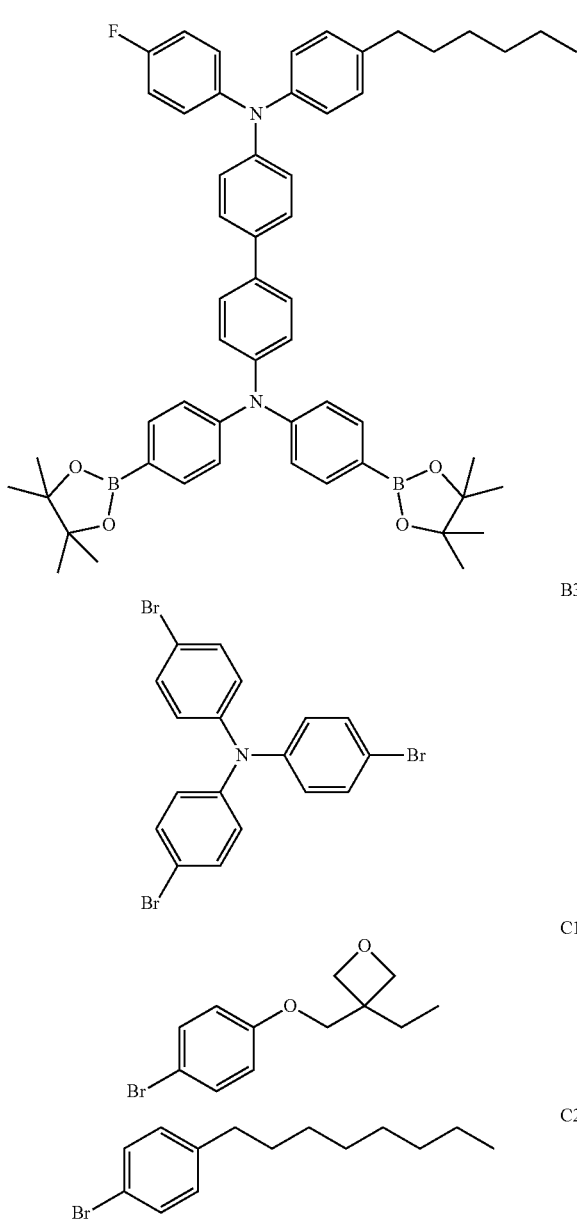

A6

B3

C1

C2

<Evaluation of Solubility of Charge Transporting Polymer (Organic Electronic Material)>

Solubility of the charge transporting polymers 1 to 14 in a solvent was evaluated.

10 mg of each of the charge transporting polymers was weighed into a sample tube (6 mL, manufactured by AS ONE Corporation). Thereafter, a stirrer was put thereinto, 1,145 µL of toluene (25° C.) was added at room temperature (25° C.), and then the mixture was stirred with the stirrer (rotation speed 600 min$^{-1}$). A dissolution time was visually observed, and a time (dissolution time) required for the polymer mixed solution to become transparent immediately after the addition of toluene was measured. The solubility of the charge transporting polymer was evaluated according to the following criteria. The dissolution time and evaluation results are shown in Table 1.

A: A dissolution time was 10 minutes or shorter
B: A dissolution time was longer than 10 minutes

TABLE 1

| Polymer | Dissolution time (min) | Evaluation result |
| --- | --- | --- |
| Charge transporting polymer 1 | 6.5 | A |
| Charge transporting polymer 2 | 3.0 | A |
| Charge transporting polymer 3 | 4.0 | A |
| Charge transporting polymer 4 | 9.5 | A |
| Charge transporting polymer 5 | 1.0 | A |
| Charge transporting polymer 6 | 12.0 | B |
| Charge transporting polymer 7 | 12.0 | B |
| Charge transporting polymer 8 | 11.0 | B |
| Charge transporting polymer 9 | 28.0 | B |
| Charge transporting polymer 10 | 11.0 | B |
| Charge transporting polymer 11 | 7.0 | A |
| Charge transporting polymer 12 | 30.0 | B |
| Charge transporting polymer 13 | 2.5 | A |
| Charge transporting polymer 14 | 10.5 | B |

As shown in Table 1, solubility of the charge transporting polymers 1 to 5, 11, and 13 was improved as respectively compared with the charge transporting polymers 6 to 10, 12, and 14. It was found that the organic electronic material containing the charge transporting polymer having the structure (1) exhibited high solubility.

<Production and Evaluation of Organic Layer>

Figure 2:
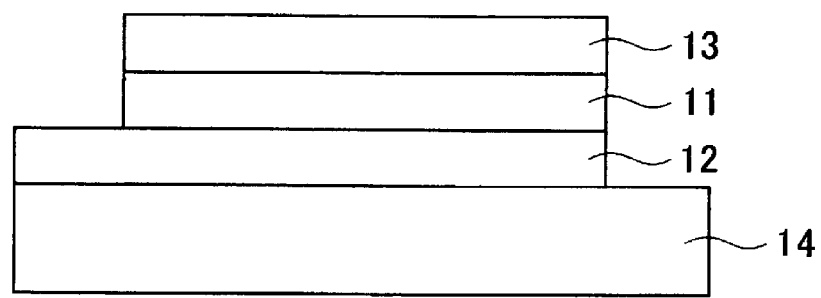
FIG. 2 is a schematic cross-sectional view showing a device for evaluation used in Examples.

Using the charge transporting polymers 1 to 14, a device for evaluation (organic hole-only device (hereinafter referred to as the "organic HOD")) was produced, and conductivity of the organic layer was evaluated. FIG. 2 shows a schematic cross-sectional view of the HOD. In FIG. 2, 11 represents an organic layer, 12 represents an anode, 13 represents a cathode, and 14 represents a substrate.

[Production of Organic HOD]

(Organic HOD 1)

The charge transporting polymer 1 (20.0 mg) was dissolved in toluene (647 µL) to obtain a polymer solution. Furthermore, the following onium salt (0.2 mg) was dissolved in toluene (101 µL) to obtain an onium salt solution. The obtained polymer solution and onium salt solution were mixed, and thereby an ink composition containing the charge transporting polymer 1 was prepared.

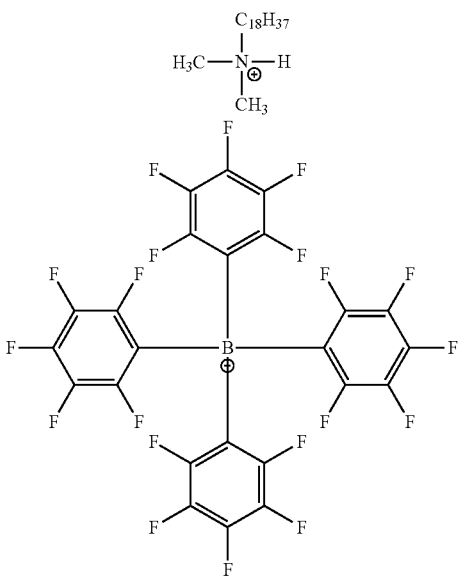

The ink composition was spin-coated in the air at 3,000 min$^{-1}$ on a glass substrate in which ITO was patterned to a width of 1.6 mm. Then, it was heated at 200° C. for 30 minutes on a hot plate in the air to form an organic layer (100 nm).

Thereafter, the glass substrate was transferred into a vacuum vapor deposition machine, Film formation of Al (100 nm) was performed on the organic layer by a vapor deposition method, a sealing treatment was performed, and thereby an organic HOD 1-A was produced.

An organic HOD 1-B was produced in the same manner as the organic HOD 1-A except that the organic layer (100 nm) was formed by heating in nitrogen at 200° C. for 30 minutes on a hot plate after spin coating.

An organic HOD 1-C was produced in the same manner as the organic HOD 1-A except that the organic layer (100 nm) was formed by heating in nitrogen at 230° C. for 30 minutes on a hot plate after being heated in the air at 200° C. for 30 minutes on the hot plate after spin coating.
(Organic HODs 2 to 14)

Organic HODs 2-A to 14-C were produced in the same manner as the organic HODs 1-A to 1-C except that the charge transporting polymer 1 was replaced with the charge transporting polymers 2 to 14.
[Evaluation of Conductivity]

A voltage was applied to the organic HOD obtained above, and a current density at 0.1 V was measured. The measurement results are shown in Table 2.

TABLE 2

| | Current density ($\times 10^{-5}$ mA/cm$^2$) | | |
|---|---|---|---|
| | A Heating in air | B Heating in nitrogen | C Heating in nitrogen after heating in air |
| Organic HOD 1 | 312 | 1,970 | 134 |
| Organic HOD 2 | 433 | 1,116 | 1,733 |
| Organic HOD 3 | 2,460 | 2,521 | 5,033 |
| Organic HOD 4 | 2,139 | 3,014 | 5,803 |
| Organic HOD 5 | 2,050 | 3,606 | 1,174 |
| Organic HOD 6 | 188 | 207 | 30 |
| Organic HOD 7 | 264 | 468 | 37 |
| Organic HOD 8 | 2,380 | 1,275 | 3,315 |
| Organic HOD 9 | 425 | 1,197 | 1,850 |
| Organic HOD 10 | 1,190 | 2,590 | 1,038 |
| Organic HOD 11 | 2,000 | 2,220 | 4,890 |
| Organic HOD 12 | 1,678 | 1,670 | 3,320 |
| Organic HOD 13 | 1,960 | 2,480 | 3,990 |
| Organic HOD 14 | 1,450 | 1,190 | 3,050 |

As shown in Table 2, a current density was improved in all of the heating conditions in the organic HODs 1 to 5, 11, and 13 as respectively compared with the organic HODs 6 to 10, 12, and 14. It was found that the organic layer formed using the organic electronic material containing the charge transporting polymer having the structure (1) exhibited high charge transportability.
<Production and Evaluation of Organic EL Element>
[Production of Organic EL Element]
(Organic EL Element 1)

The charge transporting polymer 1 (10.0 mg) was dissolved in toluene (2,200 µL) to obtain a polymer solution. Furthermore, the above-mentioned onium salt (0.2 mg) was dissolved in toluene (100 µL) to obtain an onium salt solution. The obtained polymer solution and onium salt solution were mixed, and thereby an ink composition containing the charge transporting polymer 1 was prepared. The ink composition was spin-coated in the air at 3,000 min$^{-1}$ on a glass substrate in which ITO was patterned to a width of 1.6 mm, and then it was heated in nitrogen at 200° C. for 30 minutes on a hot plate. Thereby, a hole injection layer (20 nm) was formed.

Thereafter, the glass substrate was transferred into a vacuum vapor deposition machine. Film formation was performed on the hole injection layer by a vapor deposition method in the order of NPD (40 nm), CBP:Ir (ppy)$_3$ (94:6, 30 nm), BAlq (10 nm), Alq$_3$ (30 nm), LiF (0.8 nm), and Al (100 nm). A sealing treatment was performed, and thereby an organic EL element was produced.
(Organic EL Elements 2 to 14)

Organic EL elements 2 to 14 were produced in the same manner as in organic EL element 1 except that the charge transporting polymer 1 was replaced with the charge transporting polymers 2 to 14.
[Evaluation of Organic EL Element]

When a voltage was applied to the organic EL element obtained above, green light emission was confirmed. For each of the elements, a drive voltage and luminous efficiency at an emission brightness of 1,000 cd/m$^2$, and an emission lifespan (brightness half-time) at an initial brightness of 5,000 cd/m$^2$ were measured. The measurement results are shown in Table 3.

TABLE 3

| | Drive voltage (V) | Luminous efficiency (cd/A) | Emission lifespan (h) |
|---|---|---|---|
| Organic EL element 1 | 6.6 | 30.0 | 313 |
| Organic EL element 2 | 6.8 | 29.0 | 312 |
| Organic EL element 3 | 6.6 | 29.6 | 309 |
| Organic EL element 4 | 6.9 | 28.0 | 310 |
| Organic EL element 5 | 6.7 | 31.0 | 311 |
| Organic EL element 6 | 7.0 | 30.4 | 289 |
| Organic EL element 7 | 7.1 | 29.0 | 277 |
| Organic EL element 8 | 7.2 | 28.5 | 285 |
| Organic EL element 9 | 6.9 | 30.0 | 299 |
| Organic EL element 10 | 7.1 | 29.7 | 269 |
| Organic EL element 11 | 6.5 | 30.2 | 320 |
| Organic EL element 12 | 7.0 | 27.5 | 266 |
| Organic EL element 13 | 6.3 | 38.0 | 309 |
| Organic EL element 14 | 7.5 | 28.7 | 270 |

As shown in Table 3, an emission lifespan of the organic EL elements 1 to 5, 11, and 13 was improved as respectively compared with the organic EL elements 6 to 10, 12, and 14. It was found that the organic EL element formed using the organic electronic material containing the charge transporting polymer having the structure (1) exhibited a favorable emission lifespan.

The invention claimed is:
1. An organic electronic material comprising:
a charge transporting polymer which has a branched structure and has a structural unit having a structure represented by Formula (1):

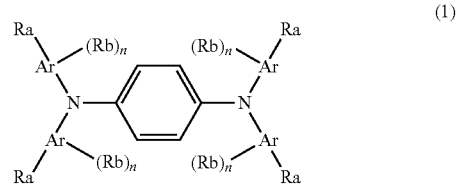

(1)

in the formula, Ar's each independently represent an aromatic ring group, Ra's each independently represent a hydrogen atom, a substituent, or a binding site with another structure, Rb's each independently represent a substituent, and n's each independently represent an integer of 0 or more, where at least one of Ra's is a binding site with another structure.

2. The organic electronic material according to claim 1, wherein the structure represented by Formula (1) includes at least one selected from the group consisting of a structure represented by Formula (1B-1) and a structure represented by Formula (1L-1):

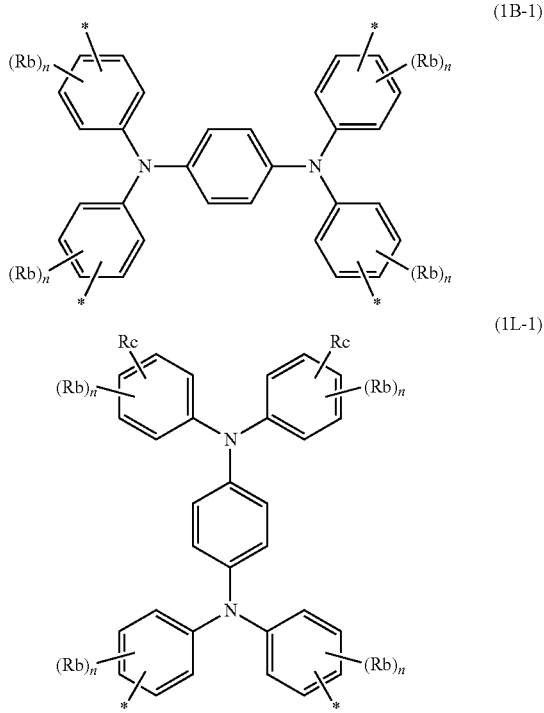

in the formulas, * represents a binding site with another structure, Rc's each independently represent a hydrogen atom or a substituent, Rb's each independently represent a substituent, and n's each independently represent an integer of 0 to 4.

3. The organic electronic material according to claim 1, wherein the charge transporting polymer further has a structural unit having at least one structure selected from the group consisting of an aromatic amine structure, a carbazole structure, a thiophene structure, a fluorene structure, a benzene structure, a pyrrole structure, an aniline structure, and a phenoxazine structure.

4. The organic electronic material according to claim 1, wherein the charge transporting polymer has at least one polymerizable functional group.

5. The organic electronic material according to claim 4, further comprising a polymerization initiator.

6. The organic electronic material according to claim 1, wherein the charge transporting polymer is a hole transporting polymer.

7. A liquid composition comprising:
the organic electronic material according to claim 1; and
a solvent.

8. An organic layer which is formed using the organic electronic material according to claim 1.

9. An organic electronic element comprising the organic layer according to claim 8.

10. An organic electroluminescent element comprising the organic layer according to claim 8.

11. An organic electroluminescent element comprising the organic layer according to claim 8 as a hole injection layer or a hole transport layer.

12. A display element comprising the organic electroluminescent element according to claim 10.

13. A lighting device comprising the organic electroluminescent element according to claim 10.

14. A display device comprising:
the lighting device according to claim 13; and
a liquid crystal element as a display means.

15. A method for manufacturing an organic electronic element, the method comprising forming an organic layer using the organic electronic material according to claim 1.

16. An organic electronic material comprising:
a charge transporting polymer which has a branched structure and has a structural unit having a structure represented by Formula (1),
wherein the branched structure has at least one structural unit B and at least three or more structural units L bonded to the one structural unit B:

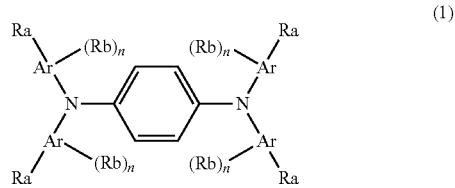

in the formula, Ar's each independently represent an aromatic ring group, Ra's each independently represent a hydrogen atom, a substituent, or a binding site with another structure, Rb's each independently represent a substituent, and n's each independently represent an integer of 0 or more, where at least one of Ra's is a binding site with another structure.

17. The organic electronic material according to claim 16, wherein the branched structure comprises a multi-branched structure having at least:
one structural unit B, and three or more structural units L bonded to the one structural unit B;
one different structural unit B bonded to each of the three or more structural units L; and
two or more different structural units L bonded to the one different structural unit B.

18. An organic electronic material comprising:
a charge transporting polymer which has a branched structure and has a structural unit having a structure represented by Formula (1):

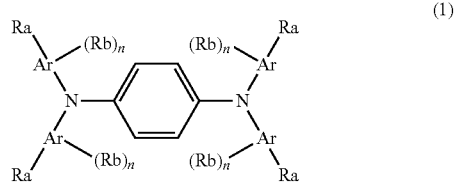

in the formula, Ar's each independently represent an aromatic ring group, Ra's each independently represent a hydrogen atom, a substituent, or a binding site with another structure, Rb's each independently represent a substituent, and n's each independently represent an integer of 0 or more, where two, three or four Ra's are binding sites with another structural unit.

* * * * *